(12) United States Patent
Ishibashi et al.

(10) Patent No.: US 8,693,193 B2
(45) Date of Patent: Apr. 8, 2014

(54) POWER CONVERTER

(75) Inventors: Satoshi Ishibashi, Chiyoda-ku (JP);
Toshio Watanabe, Chiyoda-ku (JP);
Shinsuke Idenoue, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 345 days.

(21) Appl. No.: 13/194,352

(22) Filed: Jul. 29, 2011

(65) Prior Publication Data
US 2012/0188712 A1    Jul. 26, 2012

(30) Foreign Application Priority Data
Jan. 26, 2011  (JP) ................................. 2011-013990

(51) Int. Cl.
*H05K 7/20* (2006.01)
(52) U.S. Cl.
USPC ............ 361/688; 361/689; 361/698; 361/699
(58) Field of Classification Search
None
See application file for complete search history.

(56) References Cited

U.S. PATENT DOCUMENTS

| | | | | |
|---|---|---|---|---|
| 6,898,072 B2* | 5/2005 | Beihoff et al. | ................. | 361/676 |
| 6,909,607 B2* | 6/2005 | Radosevich et al. | ........... | 361/699 |
| 7,450,388 B2* | 11/2008 | Beihoff et al. | ................. | 361/715 |
| 7,952,856 B2* | 5/2011 | Otsuka et al. | ................. | 361/624 |
| 8,169,780 B2* | 5/2012 | Yoshino et al. | ................. | 361/699 |
| 8,376,069 B2* | 2/2013 | Nakatsu et al. | ............ | 180/65.21 |
| 2003/0067748 A1* | 4/2003 | Tamba et al. | ................. | 361/699 |
| 2003/0067749 A1* | 4/2003 | Tamba et al. | ................. | 361/699 |
| 2004/0066643 A1* | 4/2004 | Beihoff et al. | ................. | 361/816 |
| 2005/0152101 A1* | 7/2005 | Rodriguez et al. | ............ | 361/605 |
| 2006/0120001 A1* | 6/2006 | Weber et al. | .................. | 361/103 |
| 2010/0025126 A1* | 2/2010 | Nakatsu et al. | .............. | 180/65.1 |

FOREIGN PATENT DOCUMENTS

| | | |
|---|---|---|
| JP | 2004-104860 A | 4/2004 |
| JP | 2005-012940 A | 1/2005 |
| JP | 2005-073374 A | 3/2005 |
| JP | 2006-081311 A | 3/2006 |
| JP | 2006-174572 A | 6/2006 |
| JP | 2010-183749 A | 8/2010 |

* cited by examiner

*Primary Examiner* — Gregory Thompson
(74) *Attorney, Agent, or Firm* — Sughrue Mion, PLLC

(57) ABSTRACT

In a power converter in which semiconductor modules are arranged on both surfaces of a cooler for downsizing, an excellent connection between control boards and a low inductance connection between smoothing capacitors and the semiconductor modules are performed at the same time. The semiconductor modules are disposed on both surfaces of the cooler, and control boards that control the semiconductor modules are arranged opposite to the respective semiconductor modules. The semiconductor modules and the cooler are held between the control boards. A current detector or a terminal block is disposed at a position perpendicular to a surface on which the cooler and the semiconductor modules contact each other, opposite to the cooler. The respective control boards disposed on both surfaces of the cooler are electrically connected by using wirings provided in the current detector or the terminal block.

27 Claims, 26 Drawing Sheets

POWER CONVERTER

BACKGROUND OF THE INVENTION

1. Field of the Invention

The present invention relates to a power converter such as an inverter using a semiconductor module.

2. Description of the Related Art

An occupied floor area can be downsized by arranging a semiconductor module on both surfaces of a cooler rather than a case in which the semiconductor module is arranged on only one surface thereof. However, when the semiconductor module is divided and arranged on both surfaces of the cooler, a connection between the semiconductor module and a control board is problematic. For example, in order to control the operation of a plurality of semiconductor modules synchronously, it is desirable to control the semiconductor module by one control board. In order to achieve this, as disclosed in JP-A-2005-73374, control terminals extend in parallel to surfaces of the cooler on which the semiconductor modules are mounted, and the control board is so arranged to face another surface of the cooler on which no semiconductor module is mounted. With this arrangement, the control terminals of all the semiconductor modules arranged on both surfaces of the cooler can be connected to one consolidated control board with the shortest length and with facility. Input and output wirings of the semiconductor modules, which are parts of a main circuit wiring, need to be arranged at an opposite side of the control terminals, that is, at an opposite side of a surface facing the control board of the cooler so as to concentrate the input wirings and the output wirings of the semiconductor module.

When the input wirings and the output wirings, which are parts of the main control wirings in which a large current flows, are concentrated and arranged, a space for arranging the output wirings in the vicinity of the input wirings, and a distance necessary for insulation between the respective wirings are required. Therefore, a smoothing capacitor connected to the input wirings cannot come close to the semiconductor modules. When the smoothing capacitor cannot come close to the semiconductor modules, a wiring inductance between the semiconductor element and the smoothing capacitor becomes larger. As a result, a switching surge voltage developed by a product of a current change rate caused by the switching operation of the semiconductor element and the wiring inductance becomes larger. When the switching surge voltage exceeds a withstand voltage of the semiconductor element such as the switching element or a reflux element mounted on the semiconductor module, the semiconductor element is broken down. Therefore, when the wiring inductance is large, there is a need to suppress the current change rate, that is, the switching speed and suppress the switching surge voltage. In this case, because the switching loss generated in the semiconductor element, that is, heating of the element becomes large, there arises such a problem that a large-sized cooler needs to be provided, or the power conversion efficiency is deteriorated. As another switching surge countermeasure, there is a method of adding a snubber circuit that suppresses the switching surge voltage. However, a space in which the snubber circuit is mounted is required, and it is difficult to downsize the power converter. As still another method, there is a method of limiting the input voltage of the power converter. However, this method suffers from such a problem that the performance of the power converter is sacrificed.

As compared with the structure of JP-A-2005-73374, in a structure of JP-A-2006-174572, although the semiconductor module is disposed on each surface of the cooler similarly, one control board is disposed to face each semiconductor module. Therefore, the semiconductor module in which the input wiring and the output wiring are disposed separately on two side surfaces is applied as disclosed in JP-A-2004-104860, the semiconductor module and the smoothing capacitor can be connected to each other with the shortest length, and the problem on the wiring inductance in JP-A-2005-73374 can be solved. However, in the structure of JP-A-2006-174572, because the control board can be divided into plural pieces, in order that the operation of the respective semiconductor modules is controlled synchronously, a control circuit and a power supply circuit are consolidated to the control board at one side, and the respective power conversion functions dispersed on both surfaces of the cooler are protected and get into synchronization, a unit for transmitting the signal between the control boards due to a harness connected through a connector mounted on the control board is required. In this case, the connector mounting space is required, and therefore a circuit scale that can be mounted on the control board decreases, the control board is upsized for mounting the required circuit scale, and a communication space of the harness is necessary. As a result, there arises such a problem that it is difficult to downsize the power converter. Also, the signal transmission distance between the control boards is long, and the influence of the noise is liable to occur. Therefore, even if the signal transmission speed between the control boards is sacrificed, that is, the performance of the power converter is sacrificed, measures that a filter is used for noise removal are required.

In configuring the power converter actually, there are required the semiconductor modules, the control boards that controls the semiconductor modules, and the cooler that cools the semiconductor module, as well as a smoothing capacitor that smoothes an input voltage of the semiconductor module, and the current detector for obtaining information used in the output control of the power converter, as exemplified by JP-A-2010-183749, JP-A-2006-81311, and JP-A-2005-12940. In the layout of those peripheral parts, various structures are proposed in JP-A-2010-183749, JP-A-2006-81311, and JP-A-2005-12940. For example, in the layout of the current detector, there is a need to connect an output control circuit that controls an output of the power converter by using current information detected by the current detector, and the current detector. However, the current information is very small as compared with the input and output voltage and current of the power converter, and it is desirable that attention is paid to adverse influence of noise, and the connection wiring is connected with the shortest length. Also, it is desirable to reduce the number of parts required for connection from the viewpoints of an improvement in the connection reliability and space saving.

In JP-A-2010-183749, a first control board having a driver circuit mounted thereon is disposed on the semiconductor module, a second control board having an output control circuit mounted thereon is disposed on the first control board, and the current detector is disposed at side surfaces of the semiconductor module and the first control board. The respective control boards and the second control board and the current detector are connected by the connector and the signal harness disposed at the current detector side of the second control board. However, because the connector and the signal harness are used, a space in which the connector is arranged, and a space for pulling the harness are required, resulting in such problems that it is difficult to downsize the power converter, and the assembling property is sacrificed by pulling the harness in a small space for downsizing.

Also, in a structure disclosed in JP-A-2006-81311, the semiconductor module and the current detector are aligned in the cooler, the control board having the output control circuit is so disposed as to cover the semiconductor module and the current detector, the current detector is connected directly to the control board by a lead pin disposed on the current detector. Thus, the structure is advantageous in downsizing because the connector and the signal harness are not provided. In order to reduce a stress generated in the terminal due to a temperature change or vibration in a limited height dimension between the control board and the cooler, the lead pin is curved in such a manner that after the lead pin extends in an opposite direction to the control board once, the lead pin is reversed and extends toward the control board. However, the complicated lead pin is guided, a fixed structure is required, and it is difficult to curve the lead pin when the device is further low in height, resulting in such a problem that it is difficult to make the height of the power converter lower.

In the layout of the smoothing capacitor, in order to obtain the power converter high in efficiency and small in size, it is necessary to reduce the wiring inductance as described above. JP-A-2006-81311 proposes a structure in which the semiconductor module is disposed on the cooler, the control board is disposed on the semiconductor module, the smoothing capacitor is disposed on the control board, and the smoothing capacitor and the semiconductor module are connected to each other on a side surface of the semiconductor module. However, the control board having a certain thickness including the parts height of the control circuit is interposed between the semiconductor module and the smoothing capacitor, and it is hard to say that the semiconductor module and the smoothing capacitor are connected to each other with the shortest length, and the wiring inductance is minimized. Also, when the semiconductor module is arranged also on a rear surface of the cooler for downsizing, not only the control board but also the cooler and the semiconductor module on the front surface side are also interposed between the semiconductor module on the rear surface side and the smoothing capacitor. As a result, the wiring inductance cannot be reduced, and a difference occurs in the wiring inductance between the semiconductor modules mounted on both surfaces of the cooler. The divided currents are not equal to each other when the semiconductor modules mounted on both surfaces of the cooler are driven in parallel, resulting in such a problem that heating of one semiconductor module becomes excessive.

Also, in JP-A-2005-12940, the semiconductor module and the smoothing capacitor are aligned in the cooler, and the semiconductor module and the smoothing capacitor can be connected to each other with the shortest length. However, when the semiconductor module are arranged on both surfaces of the cooler based on this structure, the smoothing capacitors also need to be disposed on both surfaces of the cooler. However, when a plurality of smoothing capacitors is disposed, the plurality of smoothing capacitors is connected in parallel. Resonance occurs due to an LC circuit consisting of a wiring inductance between the smoothing capacitors and capacitances of the respective smoothing capacitors, and an increase in a ripple current of the smoothing capacitor and an increase in size of the smoothing capacitor necessary for addressing this are problematic.

Also, the electrode surface of a small-diameter capacitor element is arranged orthogonal to the smoothing capacitor mounted surface of the cooler, and a plurality of capacitor elements is connected in parallel, and divided for each phase. With this structure, the height of the smoothing capacitor is lowered, and also the inductance is lowered. However, when the number of capacitor elements is large, the number of connections is larger, which makes it difficult to reduce the costs. If a plurality of parallel small-diameter elements for each phase is consolidated to one element for the purpose of reducing the number of connections for reduction of the costs, the element diameter becomes large, and the effect of the low height is lost. When the number of connections is reduced while the low height is kept, a plurality of slender elements with a small diameter is connected to each other. Therefore, the parallel structure for each phase unit becomes difficult, and the effect of the low inductance is lost. In addition, the small-diameter slender element is equivalent to an element having a small conductor sectional area (S) and a long path length (L), resulting in such a problem that the element heating ($I^2R$, $R=\rho \times L \div S$) is large, and a permissible ripple current is small.

SUMMARY OF THE INVENTION

The invention has been made in view of the above circumstances, and therefore aims at providing a power converter having semiconductor modules arranged on both surfaces of a cooler for size reduction in which an excellent connection between control boards and a low-inductance connection between smoothing capacitors and the semiconductor modules are performed at the same time.

According to the invention, there is provided a power converter including: semiconductor modules each having a semiconductor element mounted thereon; a cooler for cooling the semiconductor module; control boards that control the semiconductor modules; and a current detector that detects one of an input current and an output current of the semiconductor module, wherein the semiconductor modules are arranged on both surfaces of the cooler, wherein the current detector is arranged to face a surface of the cooler, which comes out of contact with the semiconductor module, wherein at least two of the control boards are arranged to hold the cooler, the semiconductor modules, and the current detector therebetween, and wherein the current detector has a wiring that electrically connects between the control boards.

Even if the semiconductor modules are disposed on both surface of the cooler to reduce the occupied area, the input and output terminals of the semiconductor modules extend from a plurality of side surfaces (surfaces that come out of contact with the cooler) of the semiconductor modules, and extend substantially in parallel to the part mounted surface of the control board and the semiconductor module mounted surface of the cooler. The semiconductor modules can be connected to the smoothing capacitor, the terminal block, or the current sensor with the shortest length, and the power loss caused by the main circuit wiring can be reduced.

Also, even if the semiconductor modules are disposed on both surface of the cooler to reduce the occupied area, the input and output terminals of the semiconductor modules extend from a plurality of side surfaces (surfaces that come out of contact with the cooler) of the semiconductor modules, and extend substantially in parallel to the part mounted surface of the control board and the semiconductor module mounted surface of the cooler. The semiconductor modules can be connected to the smoothing capacitor with the shortest length to reduce the wiring inductance. Therefore, the switching surge hardly occurs, and the switching loss is reduced by high-speed switching to increase the efficiency of the device. The supply voltage increases to increase the output of the device. The power loss caused by the main circuit wiring is reduced to increase the efficiency of the device. The surge suppression parts such as a snubber are eliminated, and a reduction in the size and costs of the device can be realized.

Also, the current detector is arranged in a portion where there is not cooler between the control boards so that the power converter can be thinned, the large-sized current detector can be mounted, and the connection structure of the current detector and the control board can be simplified.

Also, the current detector is arranged in a portion where there is not cooler between the control boards so that the control board can extend up to a portion facing the current detector while keeping a low height thereof, and a wiring that transmits a signal between the control boards can be disposed in the current detector.

Also, the current detector has a function of connecting the respective control boards, and no additional parts for transmitting the signal between the control boards are required. As a result, the number of parts can be reduced (no harness is required), the productivity can be improved (the connection of the control board and the current detector, and a process for the connection), and the noise influence due to the shortest connection can be reduced.

Also, the plurality of control boards are electrically connected to each other so that the connectors (location and the height are required) necessary for the signal connection with the external of the power converter can be consolidated.

Further, the current detector originally has terminals because the connection of the control board and the signal line is required. When the number of terminals is increased, and the terminals penetrate through the current detector, the connection function between the respective control boards can be easily realized, and the control board connection function can be added without an additional structure.

The foregoing and other object, features, aspects, and advantages of the invention will become more apparent from the following detailed description of the invention when taken in conjunction with the accompanying drawings.

BRIEF DESCRIPTION OF THE DRAWINGS

FIGS. 17A to 17D are diagrams illustrating an influence of an arraying direction of the capacitor element on a capacitor terminal length according to the invention;

DESCRIPTION OF THE PREFERRED EMBODIMENTS

Figure 1:
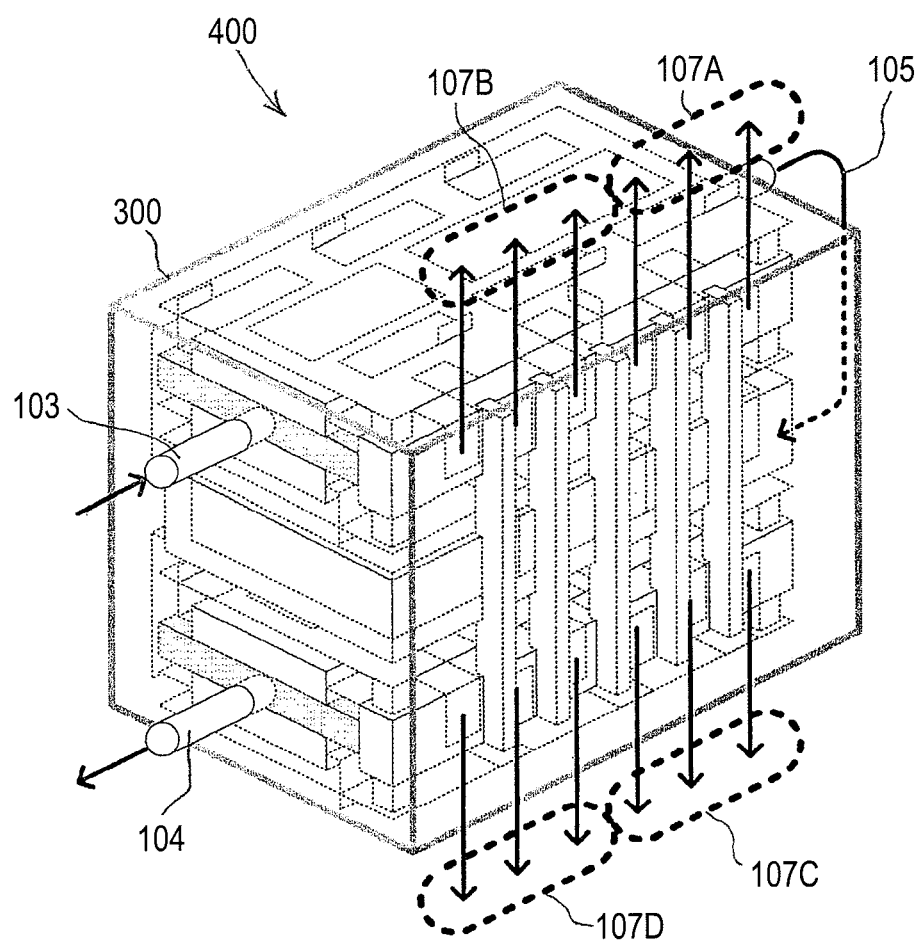
FIG. 1 is an overhead view illustrating an overall configuration of a power converter according to a first embodiment of the invention.

Hereinafter, embodiments of the invention will be described. In the drawings, the same or corresponding elements are denoted by identical symbols, and repetitive description is omitted.

First Embodiment

Figure 2:
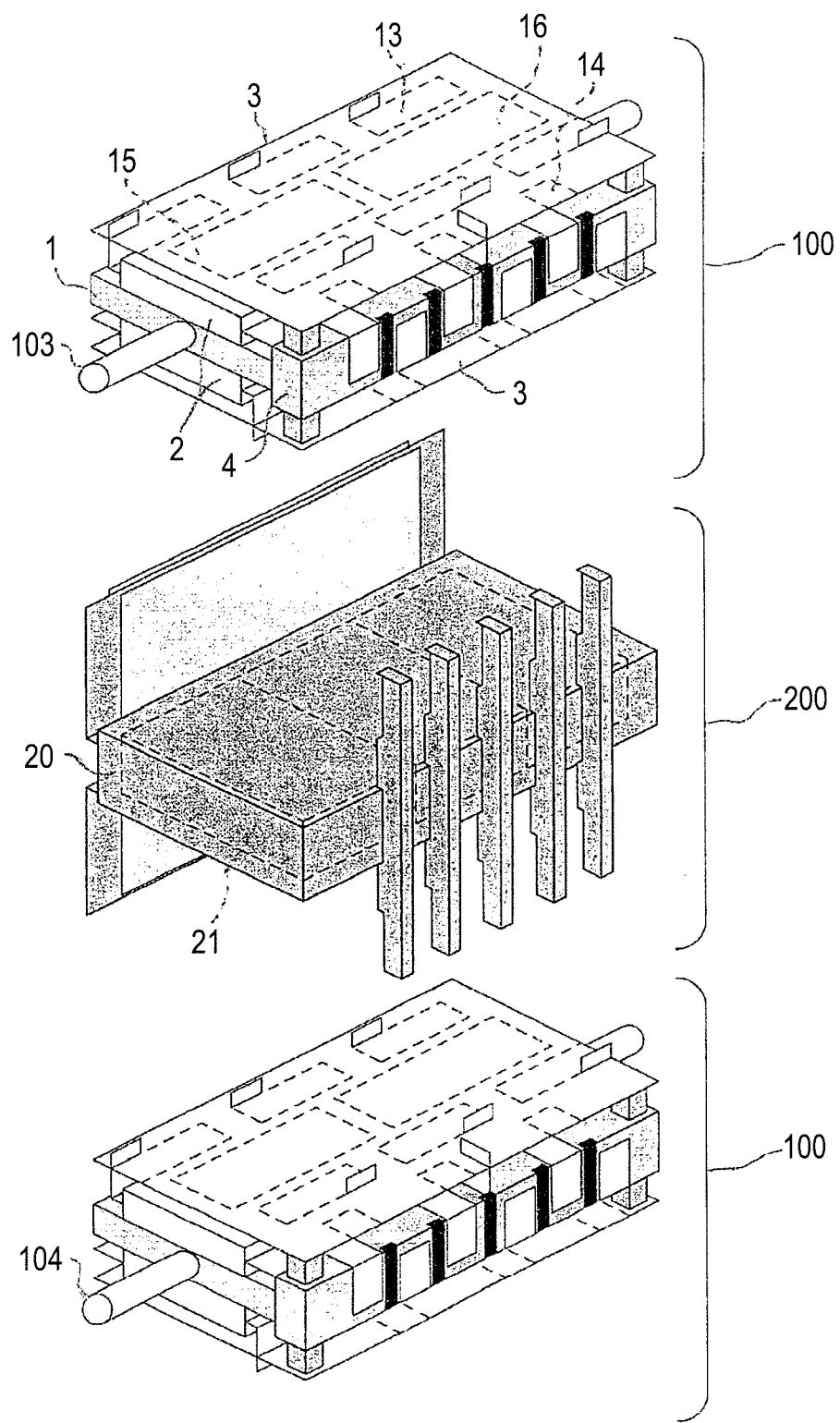
FIG. 2 is an exploded perspective view illustrating an overall configuration of the power converter according to the first embodiment.

An overall configuration according to a first embodiment of the invention will be described with reference to FIGS. 1 and 2. In a power converter 400 according to a first embodiment, one power assembly (ASSY) 100 is disposed on each surface of a smoothing capacitor unit 200, and housed in a housing 300. In the power assembly (ASSY) 100, three semiconductor modules 2 and one control board 3 are placed on each surface of a cooler 1. The power converter having four three-phase orthogonal power conversion functions is configured by the 12 semiconductor modules 2, the two coolers 1, the four control boards 3, and the one smoothing capacitor unit 200 in total. First to fourth three-phase outputs 107A, 107B, 107C, and 107D are led from the power converter. Each of the coolers 1 is provided with a cooling water inlet 103, and a cooling water outlet 104 connected to the cooling water inlet 103 through a U-turn flow passage 105.

A detailed basic configuration of the power assembly according to the first embodiment of the invention will be described with reference to FIGS. 3 to 5, and 7. The power converter illustrated in FIGS. 3 and 4 includes the semiconductor modules 2 each having a semiconductor element mounted thereon, the cooler 1 for cooling the semiconductor modules 2, the control boards 3 that control the semiconductor modules 2, and a terminal block 4 for connecting the input and output terminals 9 of the semiconductor modules 2 to an external wiring extending from a load such as a motor to be controlled by the power converter. The semiconductor modules 2 are disposed on both surfaces of the cooler 1, and the terminal block 4 is disposed to face a surface of the cooler 1 which does not contact the semiconductor modules 2. The two control boards 3 are disposed to sandwich and support the cooler 1, the semiconductor modules 2, and the terminal block 4 in a vertical direction in FIGS. 3 and 4. The two control boards 3 are connected by wirings 18 disposed in the terminal block 4. The terminal block 4 is equipped with control board holding bases 5 that hold the control boards 3, and the control boards 3 and the terminal block 4 are fixed by screws not shown. Also, as illustrated in FIG. 5, bus bar wirings 6 disposed in the terminal block 4, magnetic detection elements 7 disposed on portions of the control board 3, which face the terminal block 4, and a peripheral circuit configure a so-called coreless current detector 30 using no a magnetic core.

Figure 3:
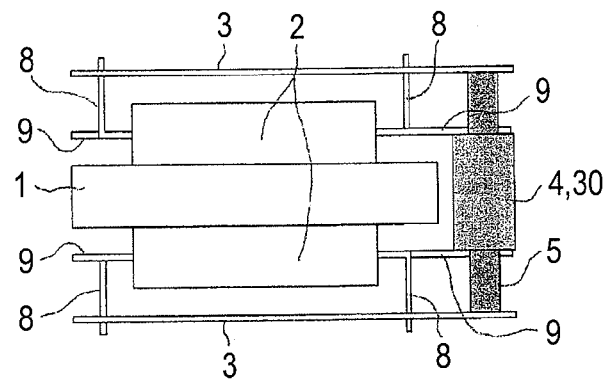
FIG. 3 is a side view illustrating a power assembly according to the invention.
Figure 4:
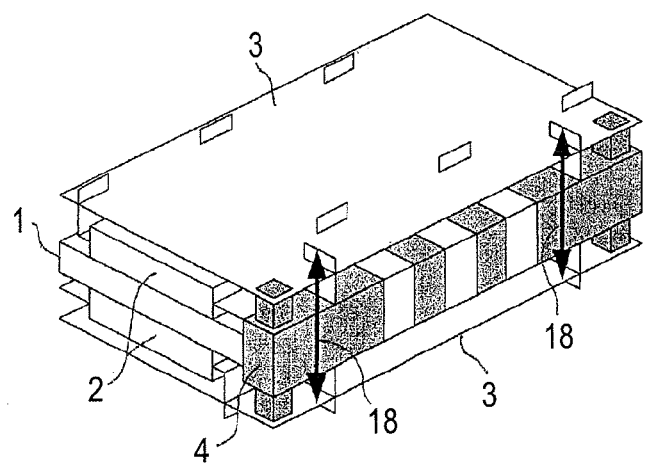
FIG. 4 is a perspective view illustrating the power assembly according to the invention.
Figure 5:
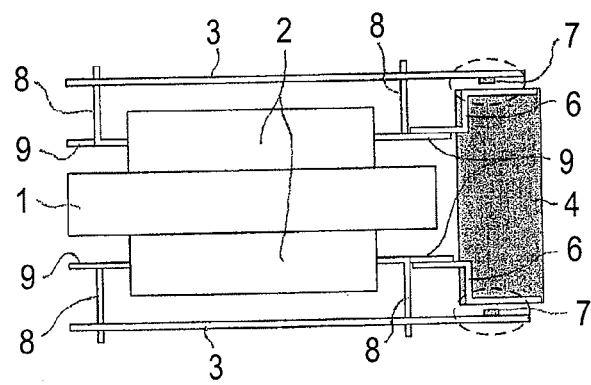
FIG. 5 is a perspective view illustrating another power assembly according to the invention.
Figure 6:
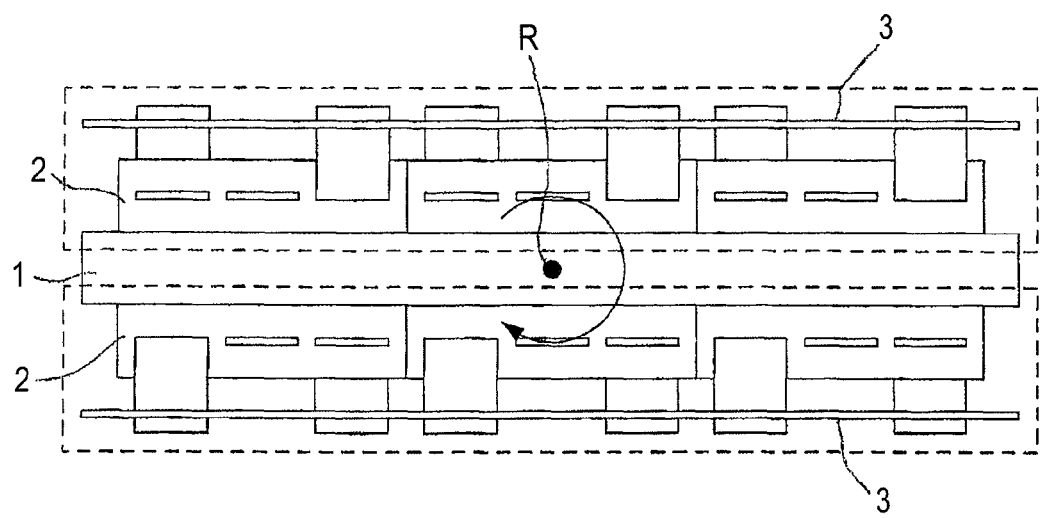
FIG. 6 is a side view illustrating a technique for commonalizing parts arranged on both surfaces of the cooler in a power assembly having two power conversion functions according to the invention.
Figure 7:
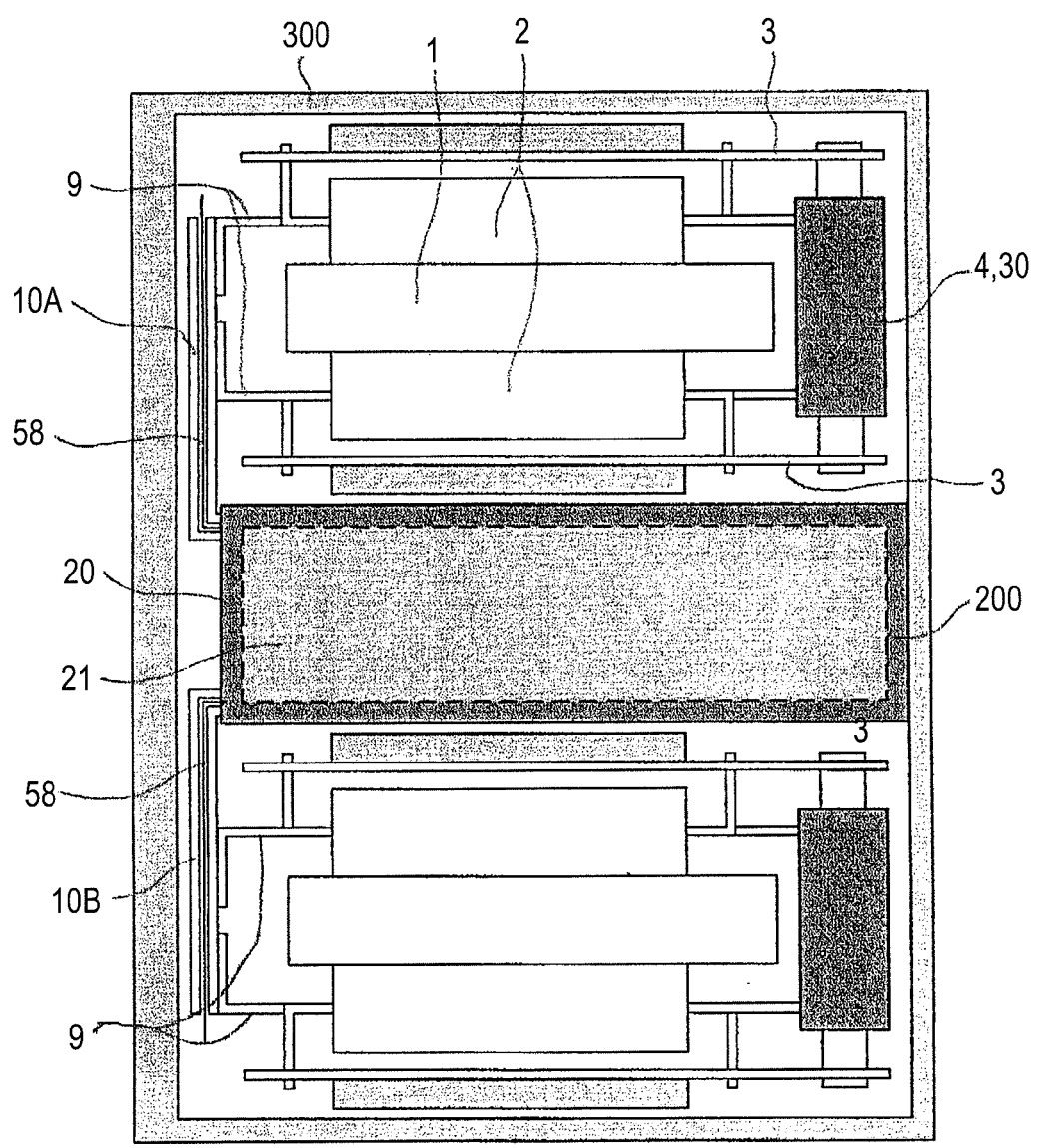
FIG. 7 is a side sectional view illustrating the power converter according to the invention.
Figure 8:
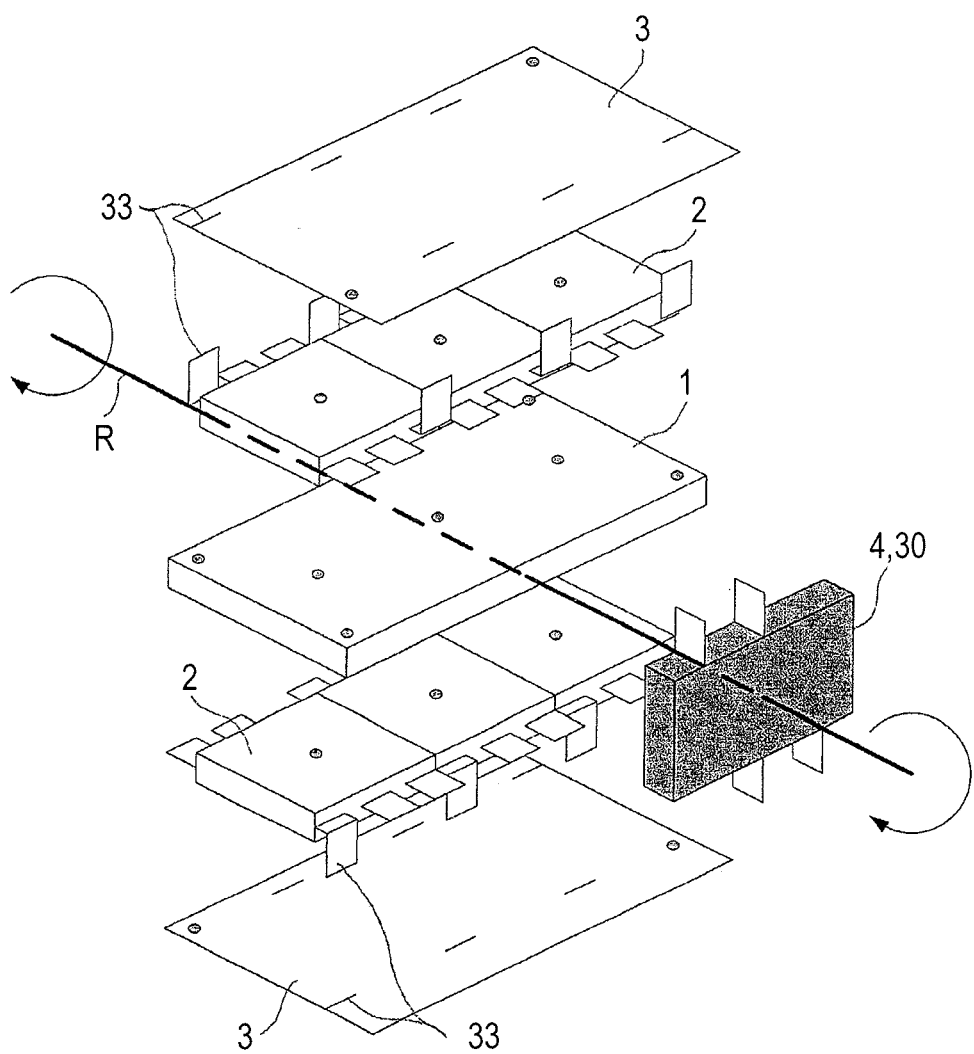
FIG. 8 is an exploded perspective view illustrating a technique for commonalizing the parts arranged on both surfaces of the cooler in the power assembly having the two power conversion functions according to the invention.

Control terminals 8 and the input and output terminals 9 of the semiconductor modules 2 extend from side surfaces substantially orthogonal to surfaces of the semiconductor modules 2 which contact the cooler 1 in the right and left direction in FIGS. 3 and 4, respectively. The control terminals 8 slightly extend to the right and the left, and are then bent substantially orthogonally toward the control boards 3, and connected to the control boards 3. The input and output terminals 9 of the semiconductor modules 2 extend substantially in parallel to a part mounted surface of the control board 3 and a semiconductor module mounted surface of the cooler 1 to the right and the left of FIG. 7. The input and output terminals 9 disposed at a left side of FIG. 7 are connected directly to positive and negative capacitor terminals 10A and 10B of the smoothing capacitor unit 200 with the shortest lengths. The capacitor terminals 10A and 10B extend vertically from one side surface of the smoothing capacitor unit 200, which does not face the control board 3, and are arranged close to each other in parallel through insulating materials 58, and the same power assemblies 100 are disposed on the upper and lower sides of the smoothing capacitor unit 200.

According to this embodiment illustrated in FIG. 3, the semiconductor modules 2 and the control board 3 are disposed on each surface of the cooler 1, and an occupied floor area can be halved as compared with the related-art power converter in which the parts are mounted on only one side of the cooler 1. In the power converter, the terminal block 4 to be connected with an external wiring extending from a load to be controlled by the power converter is required. The terminal block 4 is disposed at the side surface of the cooler 1, and can be disposed at a lower height than that when the terminal block 4 is arranged on the upper surface of the cooler 1. Since the terminal block 4 is disposed at the lower height, the terminal block 4 can be disposed between the two control boards 3. Therefore, the control boards 3 can extend up to portions facing the terminal block 4 with no increase in the height of the power converter.

When a positional relationship between the control boards 3 and the terminal block 4 is realized, the bus bar wirings 6 that are integrated into the terminal block 4 and supplied with an output current can come close to and face the control board 3. As illustrated in FIG. 5, the magnetic detection elements 7 and the peripheral circuits are disposed on portions of the control boards 3 which face the bus bar wirings 6, thereby enabling the downsized current detector 30 to be realized. In order to enhance the precision of the current detector 30, there is a need to fix the positional relationship between the bus bar wirings 6 and the magnetic detection elements 7. In this embodiment, the positional relationship between the control board 3 and the terminal block 4 is fixed by the control board holding bases 5 disposed on the terminal block 4 to fix the positional relationship between the bus bar wirings 6 and the magnetic detection elements 7. With this configuration, a high-precision current detector can be configured.

In the related-art power converter, when the control board configuring one power conversion function is divided, a harness is required for electric connection of divided portions. As a result, the size and the costs increase, a filter is required for noise superposition countermeasure for electric connection of the divided portions such as a harness to deteriorate a response, and control synchronization becomes difficult. Therefore, there are many cases in which the number of control boards configuring one power conversion function is one. In order that the semiconductor modules are disposed on both surfaces of the cooler, and the number of control boards is one, there is a need to consolidate the input and output terminals of the semiconductor modules to one side as disclosed in JP-A-2005-73374. However, this suffers from such problems that the connection of the main circuit wiring is complicated, a distance between the semiconductor modules and the smoothing capacitor is large, the switching loss increases for surge suppression due to the large wiring inductance, and the size and the costs increase due to an addition of the measure parts. However, according to this embodiment illustrated in FIG. 3, since the wirings are added to the terminal block originally required to be placed, no additional space for wiring is required, and the connection between the control boards can be performed with the shortest length. Therefore, the control board of one power converter can be divided into two, and because the number of control board is one, there is no need to consolidate the input and output terminals of the semiconductor module to one side. Because the input and output terminals are dispersed to the right and left of the semiconductor module, the semiconductor module and the capacitor terminal of the smoothing capacitor unit can be connected to each other with the shortest length while the input terminal side is not affected by the output terminal layout. Because the wiring inductance can be reduced, surge suppression due to the large wiring inductance is not required. As compared with the related-art power converter, the power converter which is small in the switching loss, size and costs can be provided.

Figure 9:
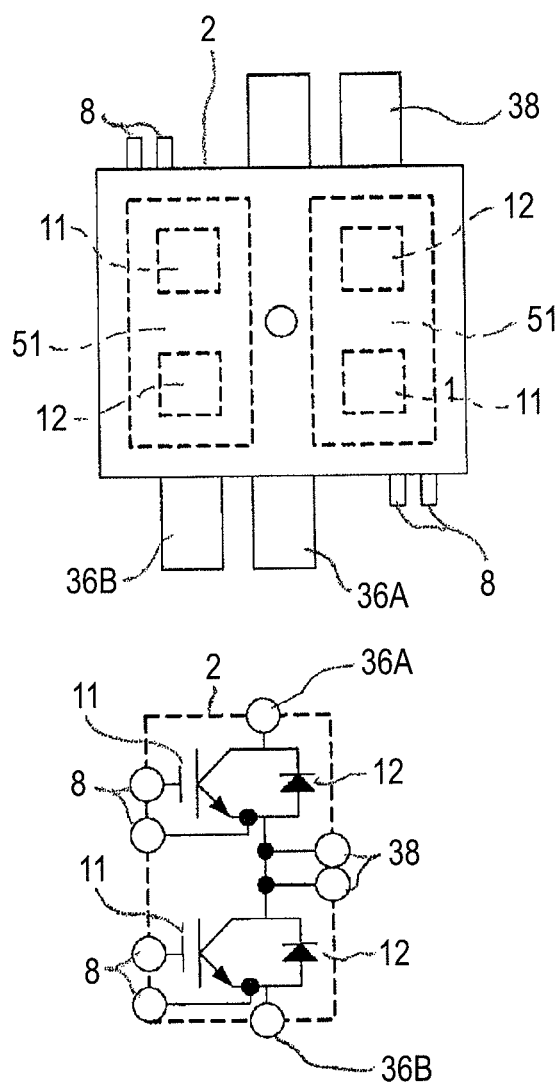
FIG. 9 is a diagram illustrating a contour and a circuit configuration of a semiconductor module in the power converter according to the invention.
Figure 10:
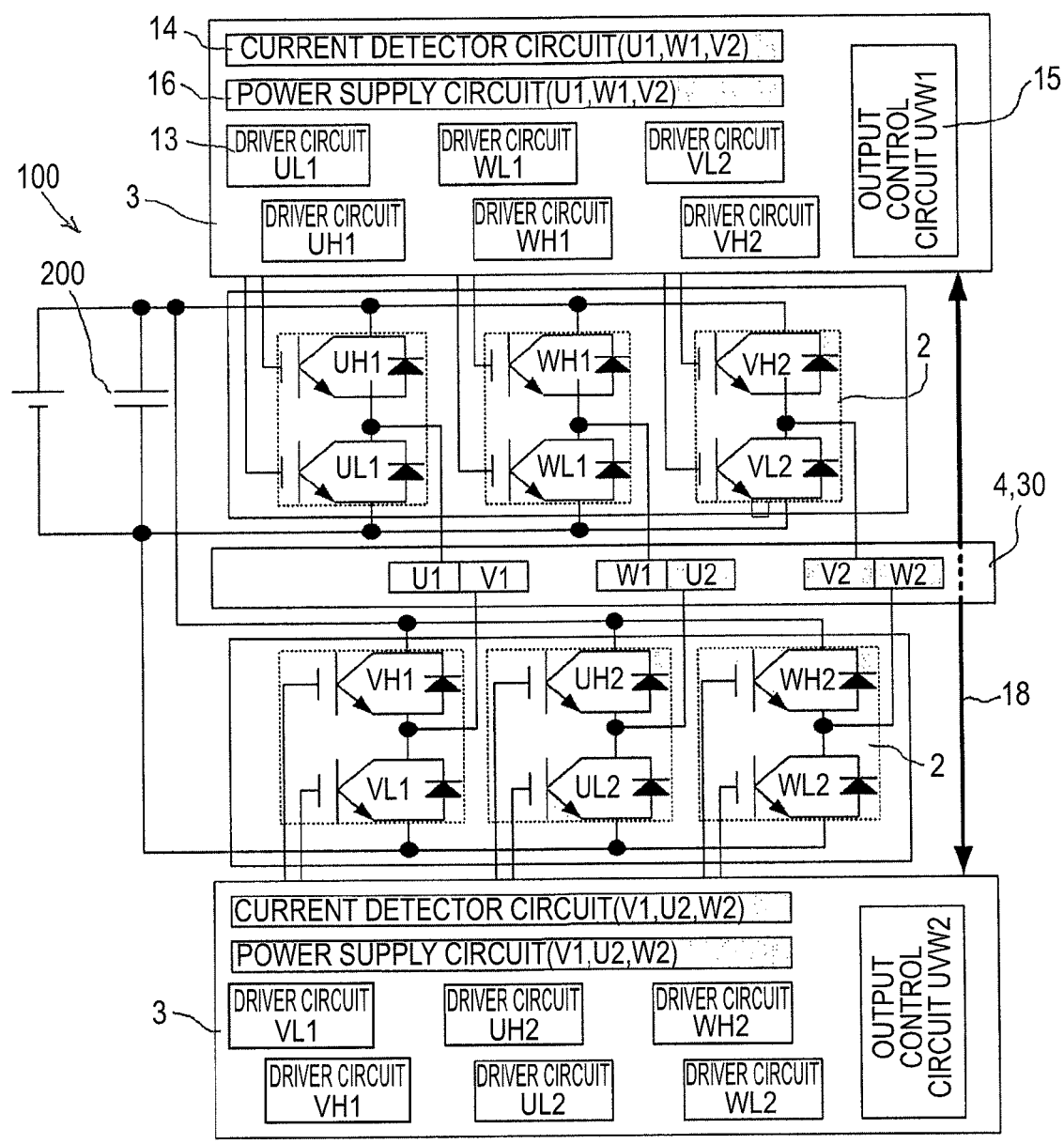
FIG. 10 is a circuit block diagram illustrating a circuit configuration of a semiconductor unit according to the invention.
Figure 11:
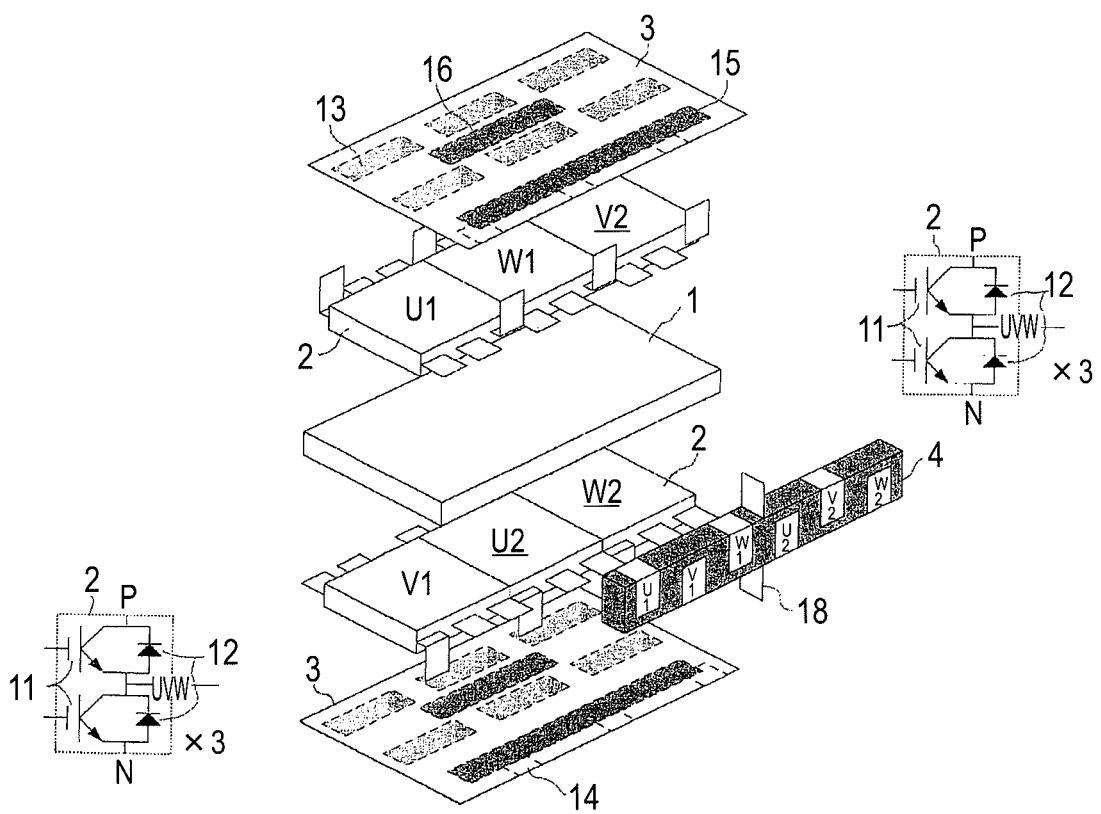
FIG. 11 is an exploded perspective view illustrating a circuit arrangement of the power assembly according to the invention.

Subsequently, in the detailed configuration of the power assembly 100 according to the first embodiment of the invention, the internal configuration of the semiconductor module, the main circuit configuration, and the parts layout of the control board will be described with reference to FIGS. 6, 8, 11, 12, and 16. First, in the internal configuration of the semiconductor modules 2 according to this embodiment, as illustrated in FIG. 9, a circuit is mounted in which two circuits in a switching element 11 and a reflux diode 12 are connected in inverse parallel are connected in series, and positive and negative DC input terminals 36A and 36B, and an AC output terminal 38 are led. Three semiconductor modules 2 are disposed on each surface of the cooler 1, and six semiconductor modules are arranged in total to configure one power assembly 100 having two three-phase orthogonal power conversion functions as illustrated in FIG. 10. One power conversion function is not configured by each surface of the cooler 1, but as illustrated in FIGS. 10 and 11, a first power conversion function formed of three phases of U1, V1, and W1 is disposed at the front side of the cooler 1, and a second power conversion function formed of three phases of U2, V2, and W2 is disposed at the back side of the cooler 1. The output terminals are aligned on the terminal block 4 in the order of U1, V1, W1, U2, V2, and W2 from the front side. Those two power conversion functions are not divided in the upper and lower portions of the cooler 1, but the two power conversion functions are mixed in each of the upper and lower portions of the cooler 1. Each of the semiconductor modules 2 is connected to the positive and negative poles of the smoothing capacitor, and any one phase of the two three-phase loads. Both of the semiconductor modules 2 arranged on the upper and lower portions of the cooler 1 have the same shape and configuration although the target phases are different from each other.

Also, as illustrated in FIG. 11, a driver circuit 13 that drives the semiconductor module 2 is mounted on a portion of the control board 3 opposite to the semiconductor module 2. Mounted on a portion of the control board 3 opposite to the terminal block 4 are a current detector circuit 14 including the magnetic detection elements 7 (refer to FIG. 5) and the peripheral circuits, an output control circuit 15 that controls an output of the power converter according to a signal from the current detector circuit 14, and has a function of transmitting a switching timing signal to the respective driver circuits 13, and an insulating circuit that insulates a reference voltage difference between the output control circuit 15 that operates with one reference voltage and the driver circuits 13 that operate with reference voltages of the respective semiconductor modules 2, and conducts level conversion. The control boards 3 mounted on the upper and lower sides of the cooler 1 each include six driver circuits 13, the three-phase current detector circuit 14, one output control circuit 15, and one power supply circuit 16. The respective control boards 3 have the same function.

More specifically, mounted on the first control board 3 are the driver circuits 13 of V1, U2, and W2, the power supply circuit 16, the current detector circuit 14, and the output control circuit 15 having the second power conversion function configured by U2, V2, and W2. Mounted on the second control board 3 are the driver circuits 14 of U1, W2, and V2, the power supply circuit 16, the current detector circuit 13, and the output control circuit 15 having the second power conversion function configured by U1, V1, and W1. By the wirings 18 that connect between the control boards disposed on the terminal block 4, current information and a power supply state of a V1 phase, and a drive signal and state information on the second power conversion function of a V2 phase, are transmitted from the first control board 3 to the second control board 3. Current information and a power supply state of a V2 phase, and a drive signal and state information on the first power conversion function of a V1 phase, are transmitted from the second control board 3 to the first control board 3.

In FIG. 9, for convenience, as the semiconductor element of each arm, an IGBT and a Di are connected in inverse parallel. However, according to an intended purpose, a plurality of elements may be connected in parallel to increase the capacity. Also, instead of the IGBT and the Di, another semiconductor element such as the MOSFET may be employed without any problem. In the semiconductor modules 2 according to this embodiment, two IGBT elements made of Si and two reflux Di elements made of Si are used to configure a circuit for one phase. In order to avoid an increase in temperature due to thermal interference between the IGBTs larger in heating than the reflex Di, the IGBT elements that are mounted on the different heat diffusion members 51 and large in heating are arranged symmetrically with respect to the center so as not to be adjacent to each other.

Figure 12:
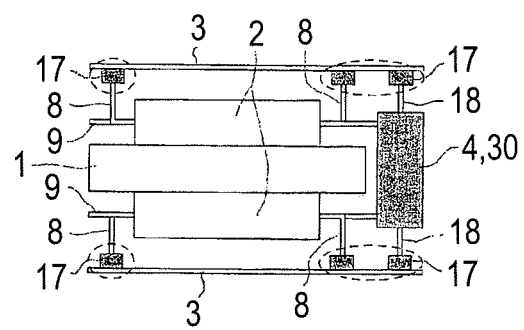
FIG. 12 is a side view illustrating another power assembly according to the invention.

According to this embodiment illustrated in FIGS. 11 and 12, two power conversion functions are dispersed and mixed in the front and rear surfaces of the cooler 1. If one power conversion function is provided for each of the front and rear surfaces of the cooler 1, the three-phase output terminals on the front and rear surfaces are superimposed one above the other to make the low height difficult. Alternatively, when the three-phase output terminals on the front and rear surfaces are aligned laterally, the output wiring of any phase becomes long, and there are influences of the wiring loss and temperature rising due to heating. However, as in this embodiment illustrated in FIGS. 11 and 12, a first semiconductor module group is arranged on the front and rear surfaces of the cooler 1 at a front side in the longitudinal direction, and a second semiconductor module group is arranged on the front and rear surfaces of the cooler 1 at a back side in the longitudinal direction. With this arrangement, the output terminals are aligned in the horizontal direction without extending the output wiring to enable the low height, and the high efficiency and the downsizing of the power converter can be performed at the same time.

When one power conversion function is dispersed as described above, the driver circuits 13, the output control circuit 15, and the power supply circuit 16, which are dispersed and mounted on the control boards 3 on the front and rear surfaces of the cooler 1, need to be electrically connected to each other. In the related-art power converter, there are adverse effects such as deterioration in response due to the noise suppression, an increase in the control substrate size due to the connector mounting or a reduction in the circuit parts mounted space, and an increase in the dead space due to the harness connection. However, in this embodiment, the driver circuits 13 corresponding to the semiconductor modules 2 dispersed on the front and rear surfaces of the cooler 1, the power supply circuit 16, and the output control circuit 15 concentrated on one side of the cooler 1 can be connected to each other with the shortest length and simply by the wirings 18 between the control boards 3 provided on the terminal block 4 having a sufficient size as compared with the connection wiring between the control boards 3 due to a limit of the insulation distance between the main circuits, which is originally necessary for connection of the main circuit wirings. Therefore, adverse effects such as the deterioration in response and an increase in the connection space can be extremely reduced.

Because the output control circuit 15 that controls the respective phases of one power conversion function in a lump cannot be dispersed, the respective driver circuits 13 that drive the respective semiconductor modules 2 arranged to face the terminal block 4 and operating according to an instruction from the output control circuit 15, individually, are dispersed at positions facing the semiconductor modules 2. However, because the respective driver circuits 13 are arranged to face the respective semiconductor modules 2, the signal wirings from the driver circuits 13 to the semiconductor modules 2 can be made shortest, and an influence of switching malfunction by a disturbance noise can be reduced. The output control circuit 15 includes signal interface circuits with various sensors requiring a weak and high-precision signal such as a current detection signal. However, the output control circuit 15 is mounted on a portion apart from the semiconductor modules 2 forming a noise source and a heating source, and located at the best environmental position within the control board from the viewpoints of the noise resistance and the temperature characteristic of the interface circuit. An insulating circuit that is the interface circuit between the output control circuit 15 and the driver circuits 13 is also located at a position which is a little affected by the temperature rising due to heating of the semiconductor modules 2 as with the output control circuit 15. The position in which the highest use temperature within the insulating circuit is lower than other parts, and which is optimum as a mounted position of a photo coupler of an insulated element which is one of heat weak parts. Because it is unnecessary to suppress the output or to increase the cooler 1 because of a limit of the use temperature range of the photo coupler. Therefore, the output density of the power converter can be improved.

The circuits each configuring one power conversion function are disposed on the two control boards 3 arranged on the front and rear surfaces of the cooler 1. Mounted on each control board 3 are six driver circuits, one power supply circuit, one output control circuit, and one-phase connection circuit for the driver circuits mounted on the other control board 3. The front and rear surfaces of the cooler 1 are common to each other, and the respective circuit layouts are also common to each other. Therefore, if the control board 3 is rotationally arranged about a rotating shaft R illustrated in FIGS. 6 and 8, the control boards 3 mounted on the front and rear surfaces of the cooler 1 can be configured by completely identical parts. The respective semiconductor modules 2 mounted on the front and rear surfaces of the cooler 1 are configured by completely identical parts on the front and rear surfaces of the cooler 1 as with the control board 3. Therefore, even if two power conversion functions are dispersed on the front and rear surfaces of the cooler 1 for the purpose of downsizing the power converter and enhancing the efficiency, there is no need to provide dedicated parts on the front and rear surfaces of the cooler 1, the number of parts can be reduced, and the costs can be reduced by central control.

Figure 13:
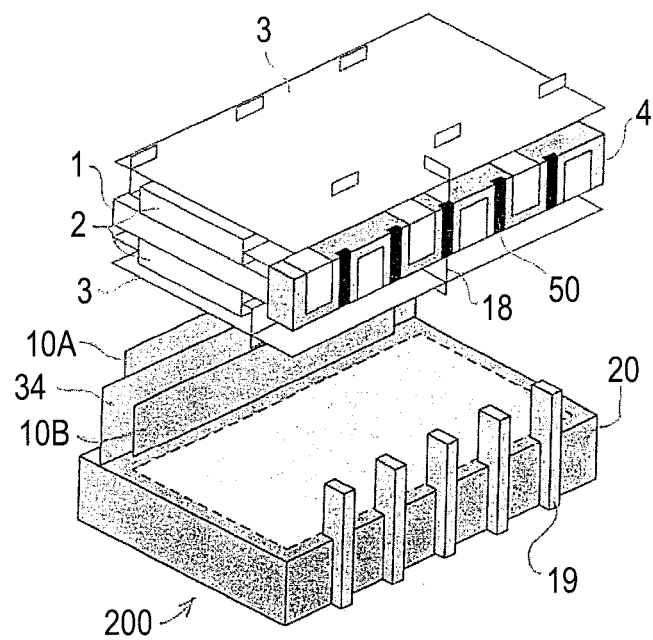
FIG. 13 is an exploded perspective view illustrating a connection configuration of the power assembly and the smoothing capacitor unit in the power converter according to the invention.

Subsequently, a description will be given in detail of the connection configuration of the semiconductor module, the control circuit, and the smoothing capacitor according to the first embodiment of the invention with reference to FIGS. 12 and 13. The smoothing capacitor unit 200 according to this embodiment is disposed below the cooler 1, the semiconductor modules 2, and the control boards 3 as illustrated in FIG. 13. The control boards 3, the semiconductor modules 2, the cooler 1, the terminal block 4, the semiconductor modules 2, and the control board 3 are stacked on the smoothing capacitor unit 200 in the stated order, and fixed to the smoothing capacitor unit 200 on the block. As illustrated in FIG. 12, the control boards 3, the input and output terminals 9 of the semiconductor modules 2, and the wirings 18 connecting between the control boards 3 provided on the terminal block 4 are electrically connected by providing connector-shaped terminal receivers 17 on the control boards 3, and fitting the semiconductor modules 2 to pin-shaped terminals disposed in the terminal block 4. The capacitor terminals 10A, 10B, and the semiconductor modules 2 are connected by screwing from a side surface of the cooler 1, that is, a side surface on which no semiconductor modules 2 is mounted. However, the connecting method is not limited to the screwing method, but may be welded, or achieved by other fixing method.

In the power converter according to this embodiment, the control boards 3, the input and output terminals 9 of the semiconductor modules 2, and the wirings 18 that connect between the control boards 3 disposed on the terminal block 4 are connected by not soldering but using the connector terminal bearings 17. Therefore, there is no need to rotate parts for connection of the control boards 3 and the semiconductor modules 2 disposed on both surfaces of the cooler 1, and the wirings provided to the terminal block 4. For that reason, an assembling method in which parts formed on the smoothing capacitor unit 200 as a base are stacked in order can be applied, and the number of parts can be reduced because the assembling property can be improved, and the upper and lower parts can be fixed in block.

The fastening of the capacitor terminals 10A, 10B, and the semiconductor modules 2 is implemented from not the vertical direction of the cooler 1 but the lateral direction. In this embodiment, the fastening of the input wiring and the output wiring to the power converter and the terminal block 4 is also implemented from the lateral direction of the cooler 1, and the assembling property is improved by aligning the assembling direction. Also, as illustrated in FIG. 13, grooves 50 for ensuring insulation distances between the wirings are provided in the terminal block 4, and insulation walls 19 for ensuring insulation between the input and output terminals, and performing a guide function at the time of inserting external wirings are disposed in a capacitor case 20 to improve the assembling property and reduce the costs with no need to add other parts.

Figure 14:
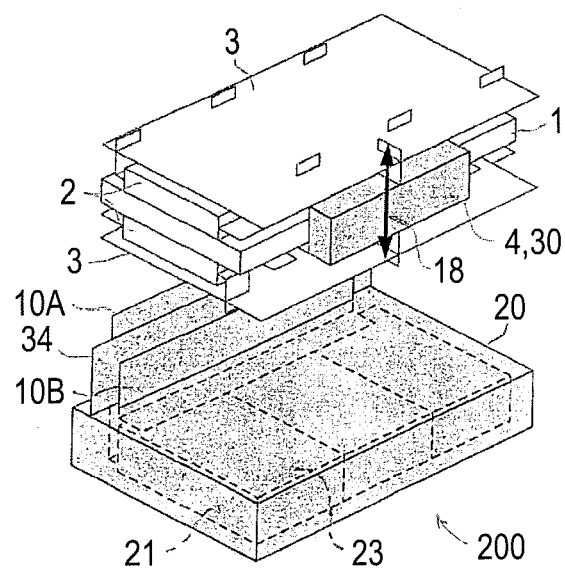
FIG. 14 is an exploded perspective view illustrating a configuration in which the smoothing capacitor unit in the power converter is disposed on a lower surface of the cooler according to the invention.

Subsequently, the details of the smoothing capacitor unit 200 according to the first embodiment of the invention will be described with reference to FIGS. 7 and 14 to 17. The smoothing capacitor unit 200 includes capacitor elements 21, a capacitor case 20 that protects the capacitor elements 21 and connects with the housing, the capacitor terminals 10A, 10B that connect the capacitor elements 21 and the semiconductor modules 2. Each of the capacitor elements 21 is a film capacitor formed in such a manner that after a PP film is wound, and the element is flattened by pressing, both ends are subjected to a terminal extracting process to provide electrode surfaces 23. As illustrated in FIG. 14, a plurality of electrode surfaces 23 is disposed substantially in parallel to the semiconductor module mounted surface of the cooler 1. A plurality of capacitor elements 21 are connected in parallel by the capacitor terminals 10A and 10B, and connected directly to the plurality of semiconductor modules 2. As illustrated in FIGS. 7 and 16, the capacitor case 20 has an opening portion 24 at a side surface that does not face the control board 3, and the terminals are consolidated to the opening portion 24. Immediately after the terminals extend from the opening portion 24 toward the external, the terminals extend up and down. After the opening portion 24 stores the capacitor element 21 and the capacitor terminals 10A, 10B, the opening portion 24 is sealed with a resin material.

Figure 15:
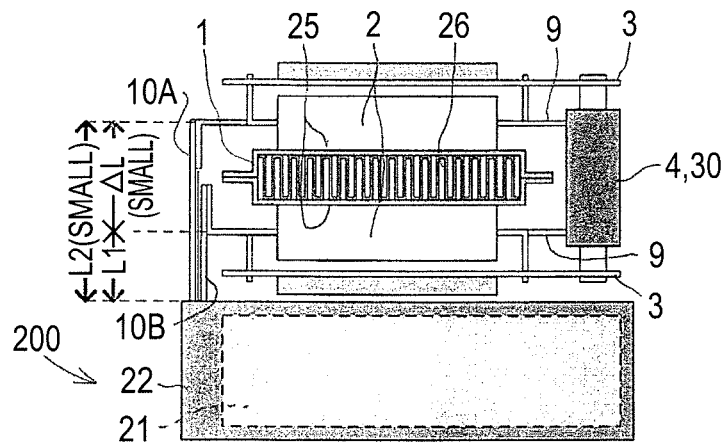
FIG. 15 is a side view illustrating a configuration in which the smoothing capacitor unit is disposed on the lower surface of the cooler according to the invention.
Figure 16:
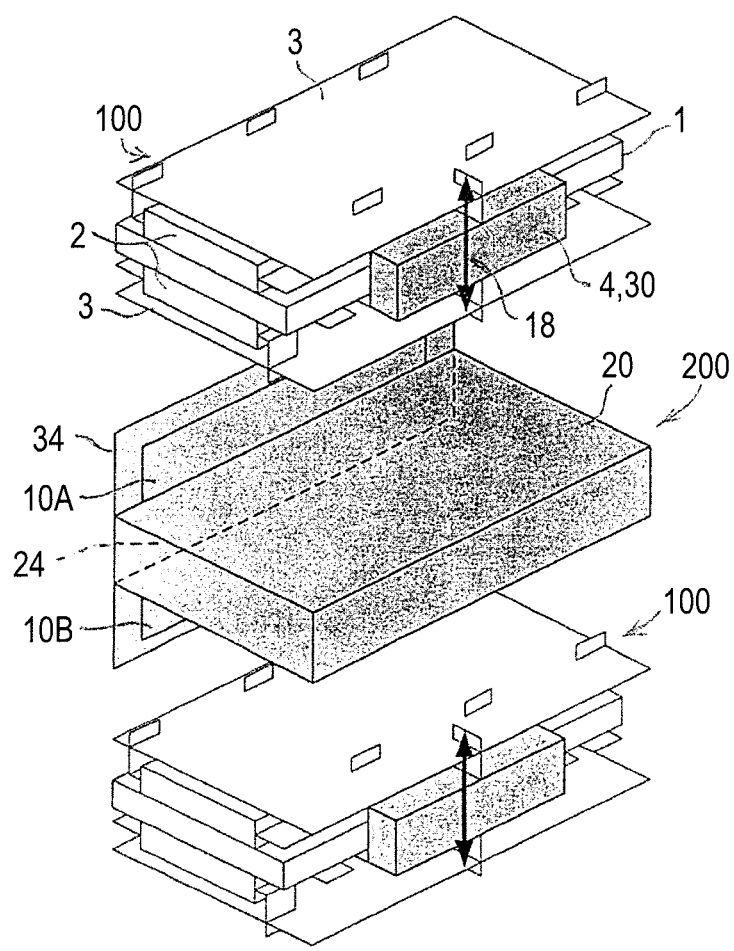
FIG. 16 is an exploded perspective view illustrating a configuration in which the smoothing capacitor unit is combined with a plurality of power assemblies according to the invention.
Figure 17A:
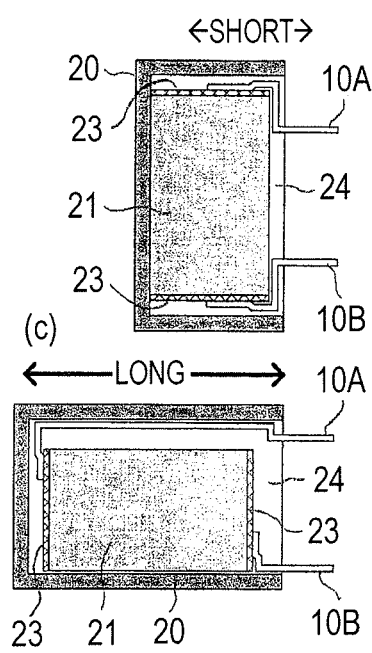
Figure 17B:
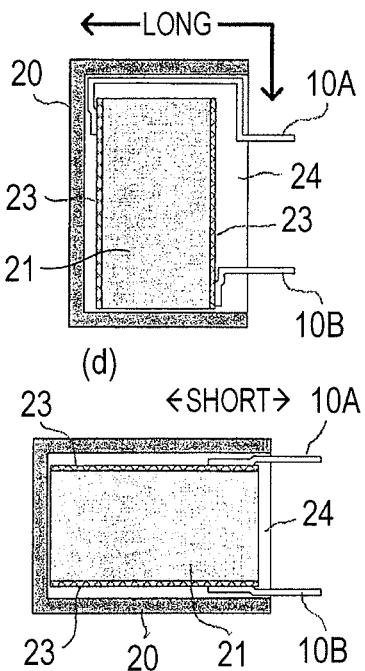

As illustrated in FIG. 15, the occupied floor area (a projected area viewed from the upper of the cooler 1) of the capacitor element 21 is slightly smaller than the floor area of the control board 3, and the capacitor terminals 10A, 10B and the capacitor case 20, which are connected to the semiconductor modules 2, are slightly projected from the floor area of the control board 3. With this shape and arrangement, the smoothing capacitor unit 200 and parts held between the two control boards 3 form a substantially rectangular solid.

As illustrated in FIG. 15, in the cooler 1 that cools the semiconductor modules 2, thin semiconductor module mounted plates 25 and a cooling fin 26 having a large radiation area with high density are manufactured as other parts to configure the thin cooler 1. As a result, an overall length L2 of the capacitor terminals 10A and 10B is reduced.

Further, in this embodiment, as illustrated in FIGS. 7, 17A, 17B, 17C and 17D, one power assembly 100 having the control boards 3, the semiconductor modules 2, and the cooler 1 as described above is disposed on each of the upper and lower surfaces of the smoothing capacitor unit 200. In this embodiment, since two power conversion functions can be realized on each of the front and rear surfaces of one cooler 1, four power conversion functions in total are realized by both of the upper and lower surfaces of the smoothing capacitor unit 200.

In FIG. 7 of this embodiment, the smoothing capacitor unit 200 is arranged to face a surface of the cooler 1, which contacts the semiconductor module 2. The power assembly 100 having the cooler 1, the semiconductor modules 2, and the control boards 3 is arranged on each of the upper and lower surfaces of the smoothing capacitor unit 200. With this configuration, the reduction in the floor area of the power converter and the plurality of power conversion functions are integrated with each other. For description, in this example, the power conversion functions are arranged on the upper and lower surfaces of the smoothing capacitor unit 200, but the vertical and horizontal directions are not limited, and when the low height is important more than the reduction in the floor area, the entire device may rotate so that the vertical arrangement and the horizontal arrangement may be replaced with each other.

As illustrated in FIGS. 17A to 17D, the capacitor element 21 illustrated in FIG. 14 is arranged so that the electrode surfaces 23 are substantially in parallel to the mounted surface of the semiconductor modules 2 of the cooler 1 (refer to FIGS. 36A and 36B). As compared with alignment substantially in the vertical direction, the overall length of the capacitor element 21 and the overall lengths of the capacitor terminals 10A and 10B are shortened. The reduction in the size and weight of the power converter, the reduction in the costs, and the enhancement in efficiency due to the reduction of the wiring loss are realized.

As illustrated in FIGS. 7 and 15, the occupied floor area (projected area viewed from the upper of the cooler 1) of the capacitor element 21 is smaller than the floor area of the control board 3. The capacitor terminals 10A, 10B and the capacitor case 20, which are connected to the semiconductor modules 2, are slightly projected from the floor area of the control board 3. With this arrangement, the smoothing capacitor unit 200 and parts held between the two control boards 3 form a substantially rectangular solid. Therefore, since storability of the housing 300 is excellent, the excellent assembling property is obtained, and a useless space can be reduced, the power converter can be downsized.

Also, as illustrated in FIG. 15, if the cooler 1 is manufactured as other parts of the thin semiconductor module mounted plates 25 and the cooling fin 26 having a large radiation area with high density, both of the higher cooling performance and the thinning of the cooler 1 can be performed. When the cooler 1 is thinned, a distance from the capacitor element 21 to the semiconductor modules 2 is shortened. Therefore, since the wiring inductance can be reduced, the switching surge suppression is not required, and the downsized and high-efficiency power converter can be realized. In addition, because a difference ($\Delta$L) between a wiring inductance (L2) between the semiconductor module 2 on the front side of the cooler 1 and the capacitor element 21, and a wiring inductance (L1) between the semiconductor module 2 on the rear side of the cooler 1 and the capacitor element 21 becomes small. Therefore, although being different from this embodiment, even if the inductance difference between the semiconductor modules 2 on the front side of the cooler 1 and the semiconductor modules 2 on the rear side thereof is problematic, for example, if the semiconductor modules 2 on the front and rear surfaces of the cooler 1 are connected in parallel in use, the influence of the inductance difference can be reduced. Therefore, this embodiment in which the cooler 1 is thin can be applied to various circuit configurations.

This embodiment exemplifies the power converter having two power conversion functions provided to each of the upper and lower surfaces of the smoothing capacitor unit 200, and functioning as four orthogonal power converters to control four motors. However, it is not always necessary to provide two power conversion functions to one cooler. For example, a power assembly configured by the power converter according to the second embodiment which will be described later is provided to the upper surface of the smoothing capacitor unit 200, and the power assembly configured by the power converter according to the first embodiment is provided to the lower surface thereof. With this configuration, two small-capacitive motor control functions and one large-capacitive motor control function can be provided. Not a DC-AC power conversion function, but a DC-DC power conversion function is provided to one side of the smoothing capacitor unit 200 to provide two motor control functions and a power supply boosting function. The combination of this embodiment with the second embodiment can provide the power conversion functions of 1 to 4 at the maximum, and can be applied to various capacitance and circuit configurations.

Second Embodiment

Figure 18:
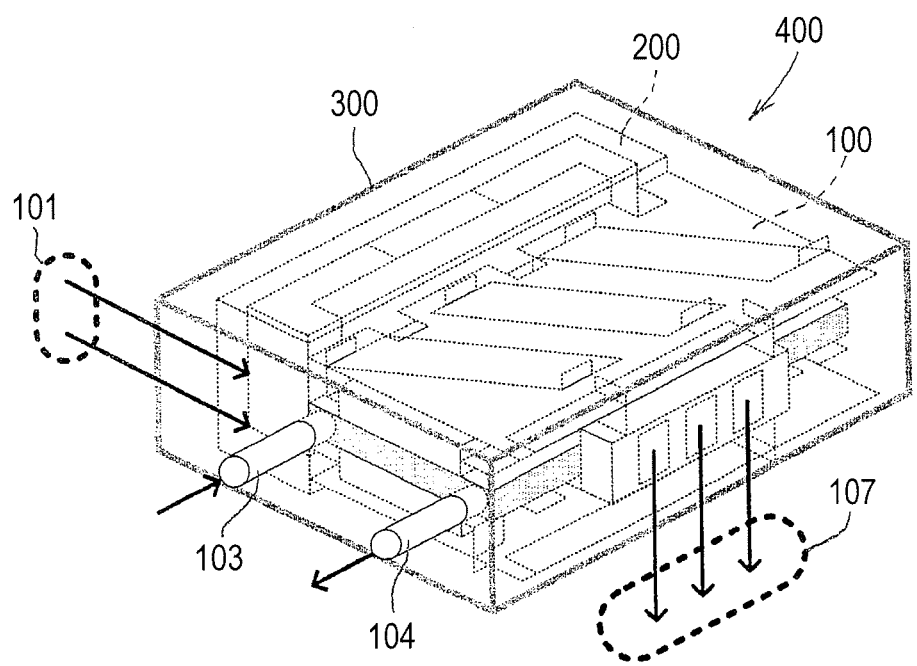
FIG. 18 is an overhead view illustrating an overall configuration of a power converter according to a second embodiment of the invention.
Figure 19:
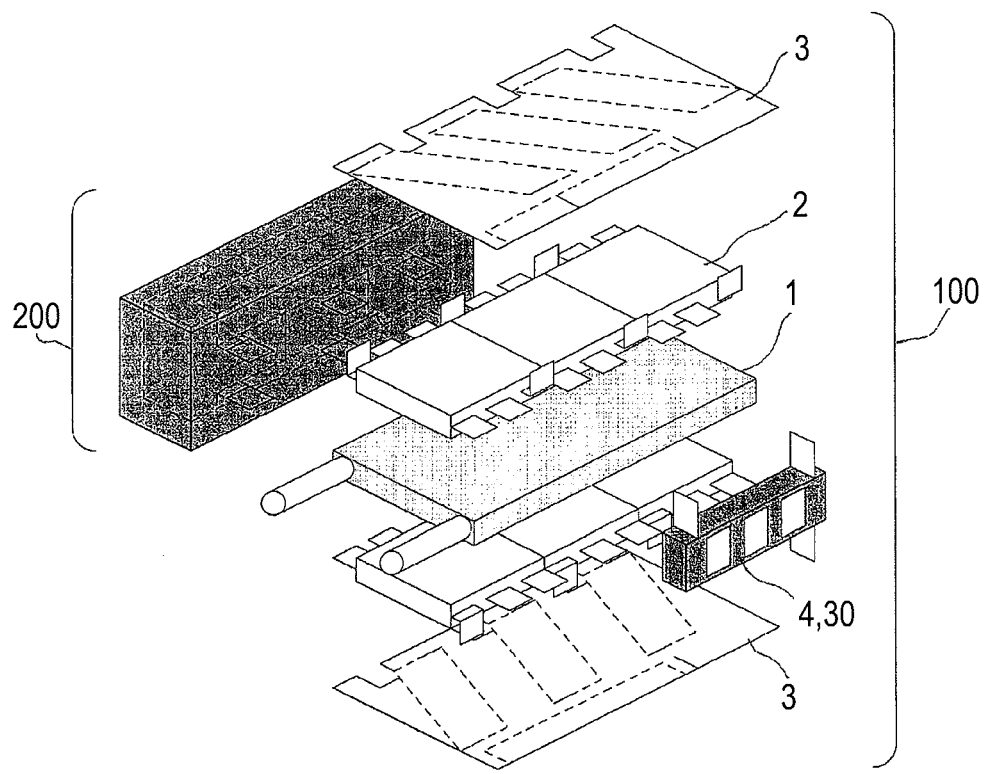
FIG. 19 is an exploded perspective view illustrating a smoothing capacitor unit and a power assembly according to a second embodiment.

The entire configuration according to a second embodiment of the invention is illustrated in FIGS. 18 and 19. A power converter 400 according to the second embodiment is configured to arrange the smoothing capacitor unit 200 on one side of the power assembly 100 housed in a housing 300. The power converter 400 includes a DC input 101, a three-phase output 107, a cooling water inlet 103, and a cooling water outlet 104. This embodiment exemplifies the power converter having only one large-capacity three-phase orthogonal power conversion function based on the power assembly of the first embodiment. A description will be given of a configuration that the large-capacity power conversion function is realized on the basis of the layout of the smoothing capacitor unit and the power assembly of the first embodiment when only one power assembly is provided.

A basic configuration of the power converter according to the second embodiment of the invention will be described with reference to FIGS. 20 and 21. The power converter illustrated in FIG. 20 includes the semiconductor modules 2 each having a semiconductor element mounted thereon, the cooler 1 for cooling the semiconductor modules 2, the control boards 3 that control the semiconductor modules 2, and a current detector 30 that detects an output current of the semiconductor modules 2. The semiconductor modules 2 are disposed on both surfaces of the cooler 1, and the current detector 30 is disposed to face a surface of the cooler 1 which does not contact the semiconductor modules 2. The two control boards 3 are disposed to sandwich and support the cooler 1 and the semiconductor modules 2. The current detector 30 and the two control boards 3, and two control boards 3 are connected to each other by wirings 18 that connect the respective control boards, which are provided in the current detector 30.

The control terminals 8, and the input and output terminals 9 extend toward the right and left from side surfaces substantially orthogonal to surfaces of the semiconductor modules 2, which contact the cooler 1. The control terminals 8 slightly extend to the right and the left, and thereafter are bent substantially orthogonally toward the control board 3, and connected to the control board 3. As illustrated in FIG. 21, the input and output terminals 9 of the semiconductor modules 2 extend to the right and the left substantially in parallel to the part mounted surface of the control board 3 and the semiconductor module 2 mounted surface of the cooler 1. The input and output terminals 9 disposed at the left side in the figure are connected to the terminal portion of the smoothing capacitor unit 200 with the shortest length. The input and output terminals 9 disposed at the right side in the figure are connected to a load such as a motor to be controlled by the power converter not shown through the current detector 30.

Figure 20:
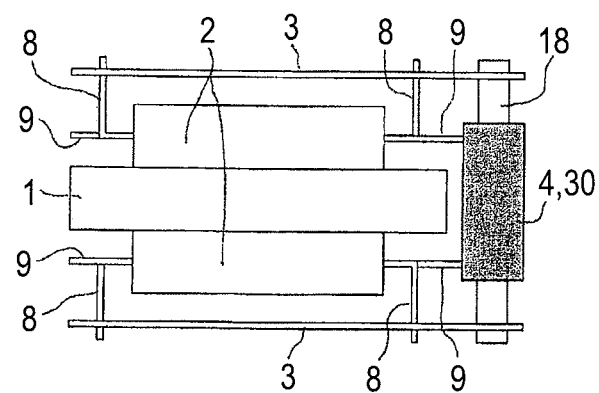
FIG. 20 is a side view illustrating another power unit according to the invention.
Figure 21:
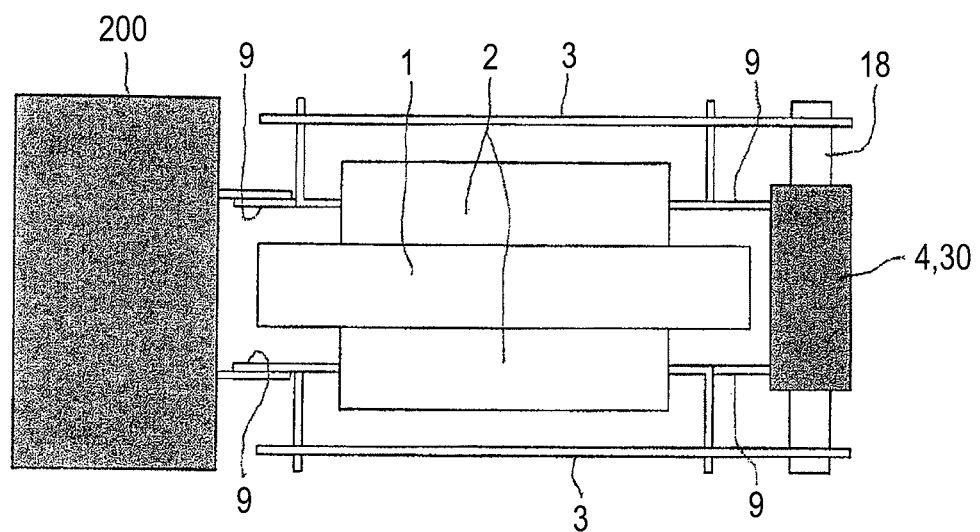
FIG. 21 is a side view illustrating a smoothing capacitor unit and a power assembly according to the second embodiment.

According to this embodiment illustrated in FIG. 20, the semiconductor modules 2 and the control board 3 are disposed on each surface of the cooler 1, and the occupied floor area can be halved as compared with the related-art power converter in which the parts are mounted on only one surface of the cooler 1. In order to control the output of the power converter, the current detector 30 is frequently required. The current detector 30 is disposed at a side surface of the cooler 1, and the low height can be achieved as compared with a case in which the current detector 30 portion is disposed on the upper surface of the cooler 1. When the current detector 30 is arranged to be low in height, the current detector 30 is housed between the two control boards 3. Therefore, the control board 3 can be extended up to a portion facing the current detector 30 without increase in the height of the power converter. Since the current detector 30 having the connection wiring to the control board 3 is disposed to face the control board 3, an electric connection between the current detector 30 and the control board 3 is conducted through no additional parts such as a harness. Also, an electric connection between the two control boards 3 can be conducted with provision of the wirings 18 that penetrate through the current detector 30.

In the related-art power converter, when the control board configuring one power conversion function is divided, a harness is required for electric connection of the divided portions. As a result, the size and the costs increase, a filter is required for noise superposition countermeasure against the divided portions to deteriorate a response, and control synchronization becomes difficult. Therefore, there are many cases in which the number of control boards configuring one power conversion function is one. In order that the semiconductor modules are disposed on both surfaces of the cooler, and the number of control boards is one, there is a need to consolidate the input and output terminals of the semiconductor modules to one side as disclosed in JP-A-2005-73374. However, this suffers from such problems that the connection of the main circuit wiring is complicated, a distance between the semiconductor modules and the smoothing capacitor is large, the switching loss increases for surge suppression due to the large wiring inductance, and the size and the costs increase due to an addition of the measure parts. However, according to this embodiment illustrated in FIG. 21, since the control boards 3 are connected by the wirings 18 disposed in the current detector 30, there is no need to consolidate the control boards 3 to one, and the input and output terminals 9 of the semiconductor modules 2 can be dispersed to the right and left. With the dispersed arrangement, the semiconductor modules 2 and the smoothing capacitor unit 200 can be connected to each other with the shortest length at the input side. As a result, the wiring inductance becomes the smallest, surge suppression is not required. As compared with the related-art power converter, the power converter which is small in the switching loss, size and costs can be provided.

Figure 22:
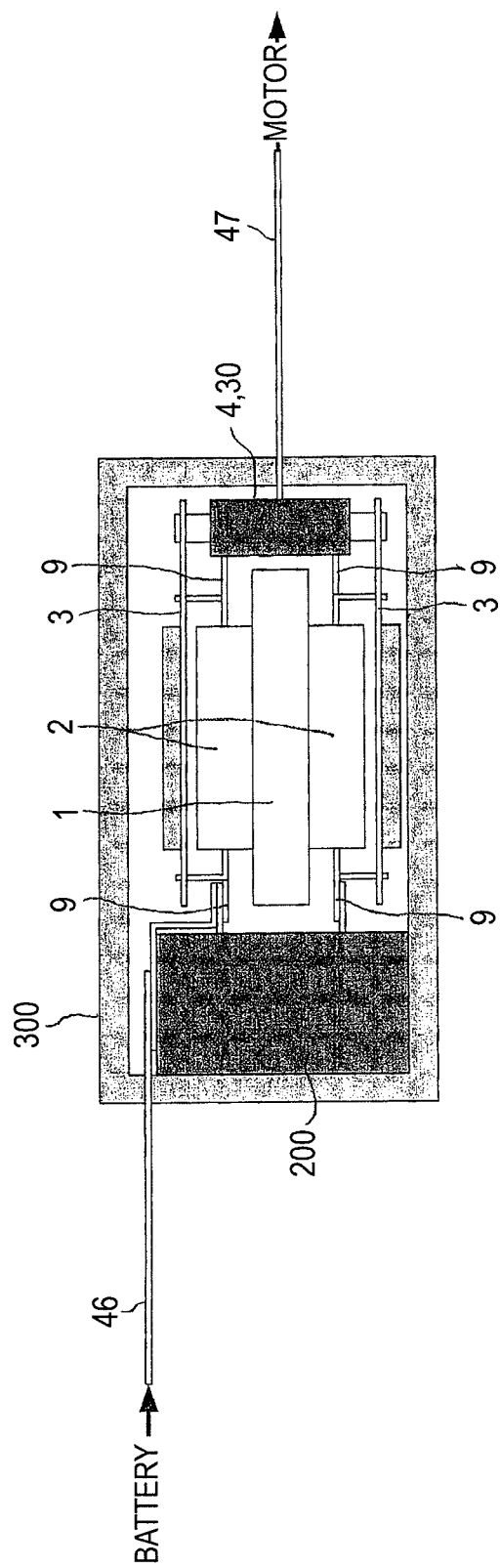
FIG. 22 is a conceptual diagram illustrating an arrangement of input and output terminals in a power converter according to the second embodiment.
Figure 23:
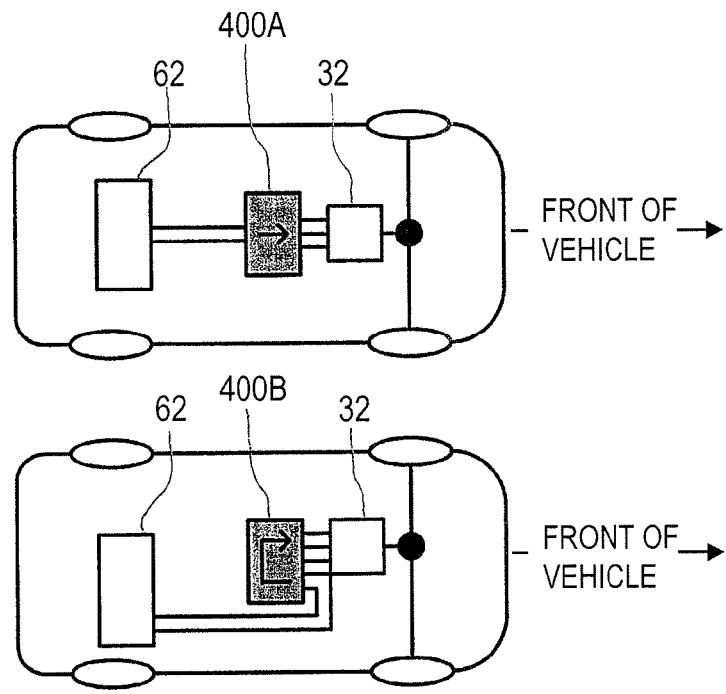
FIG. 23 is a conceptual diagram illustrating an arrangement in which the power converter is applied to an electric vehicle according to the second embodiment.

Also, the input and output terminals 9 of the semiconductor modules 2 are divided to the right and the left in FIG. 22, and the smoothing capacitor unit 200 that is an input side of the power converter, and the current detector 30 that is an output side of the power converter are arranged at the respective terminals. According to this embodiment, as illustrated in FIG. 22, when the input side 46 and the output side 47 of the power converter are dispersed at opposing positions of the housing 300, an electric power can be supplied from one of the housing 300 to the other thereof without a useless wiring path, and a reduction in the power loss due to the wiring, that is, a reduction in the loss of the power converter and higher efficiency can be performed. Let us consider a case in which the power converter is used as a three-phase DC power converter, and applied to a hybrid electric vehicle having an engine and motor 32 as power sources or an electric vehicle having only the motor 32 as a power source, as illustrated in FIG. 23. The motor 32 as the power source is mounted in front of the vehicle such as an engine room close to a driving shaft of the vehicle. On the other hand, a battery 62 with a chemical reaction is frequently mounted within a passenger compartment which is mainly in the rear of the engine room from the viewpoints of the limit of the use temperature environment and the safety at the time of impact. The input and the output of the power converter disposed between the battery 62 mounted in the rear of the vehicle and the motor 32 mounted in front of the vehicle are arranged at the opposing positions of the housing 300. In this case, as compared with a related-art power converter 400B, in a power converter 400A according to the invention, a wiring extending from the battery 62 to the motor 32 can be made shortest without a useless detour, which is therefore advantageous in power loss reduction. In FIGS. 22 and 23, the respective input and output terminals are disposed at the opposing surfaces of the housing 300. However, it is not always necessary to dispose the input and output terminals at the opposing positions. According to the vehicle layout, the input may be arranged at the rear side of the power converter side surface, and the output may be arranged at the front side of the power converter side surface, and the equivalent low loss effect is obtained if there is no remarkable detour in the current path.

Figure 24:
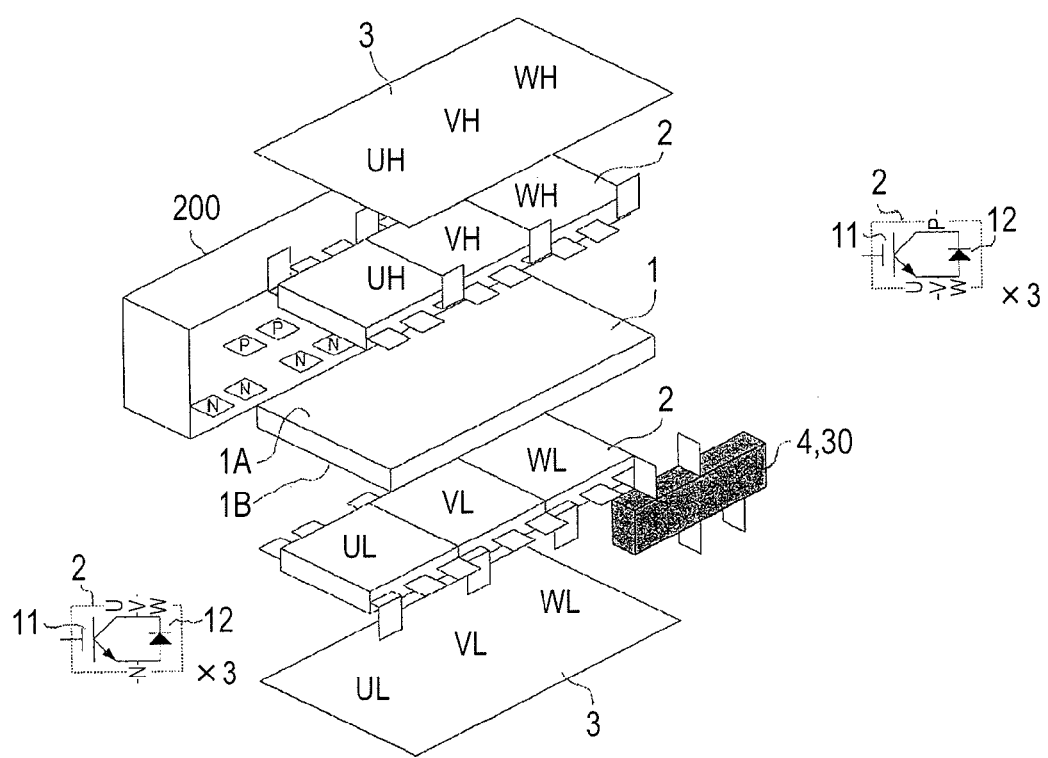
FIG. 24 is an exploded perspective view illustrating a circuit arrangement of the power converter having one power conversion function according to the second embodiment.
Figure 26:
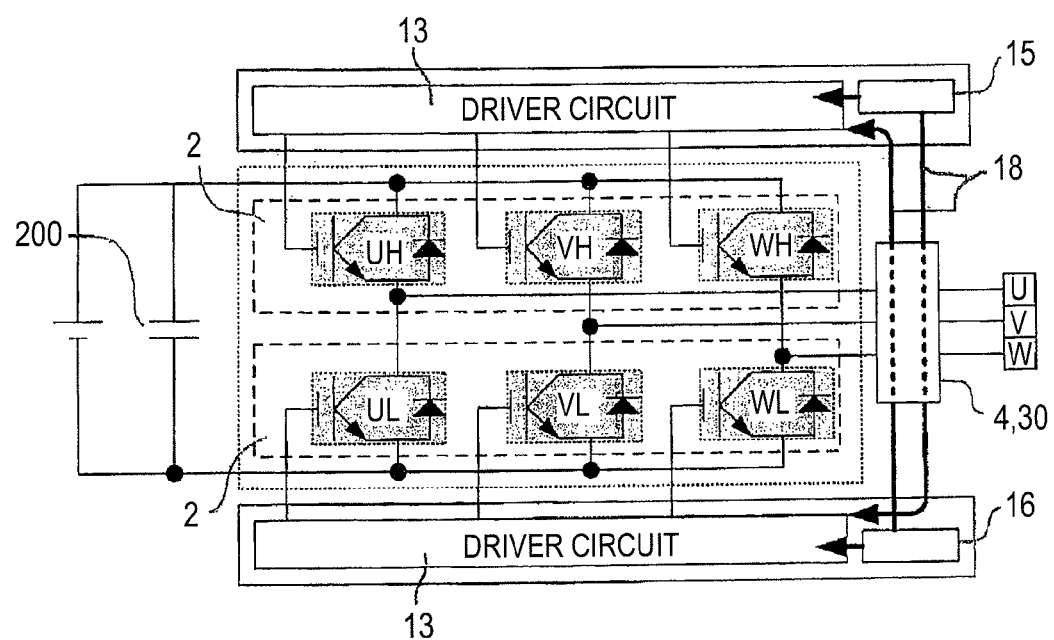
FIG. 26 is a circuit block diagram illustrating an arrangement of an output control circuit and a power supply circuit according to the invention.
Figure 27:
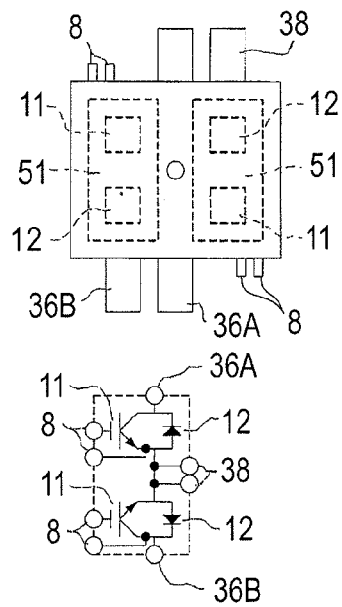
FIG. 27 is a diagram illustrating a contour and a circuit configuration of a semiconductor module in another power converter according to the invention.

Subsequently, the semiconductor module configuration, the main circuit configuration, and the parts layout of the control boards according to the second embodiment of the invention will be described in detail with reference to FIGS. 24 to 28. First, as illustrated in FIG. 24, three semiconductor modules 2 each having the one switching element 11 and the one reflux diode 12 are disposed on each surface of the cooler 1 so that six semiconductor modules 2 in total are arranged on the cooler 1. The respective semiconductor modules 2 mounted on an upper surface 1A of the cooler 1 are connected to a positive pole P side, and the respective semiconductor modules 2 mounted on a lower surface 1B of the cooler 1 are connected to a negative pole N side. Those semiconductor modules 2 are connected in series with each other to configure the three-phase orthogonal power converter as illustrated in FIG. 26. In FIG. 26, for convenience, one IGBT and one Di are connected in inverse parallel in the semiconductor element of each arm. However, a plurality of elements may be connected in parallel to increase the capacity according to the intended purpose. Not IGBT and Di but other semiconductor elements such as an MOSFET may be applied without any problem. In the semiconductor module according to this embodiment, for the purpose of increasing the capacity, as illustrated in FIG. 27, two IGBT and two Di are connected in parallel. At the same time, in order to avoid an increase in temperature due to thermal interference between the heating parallel elements, the parallel elements are mounted on the different heat diffusion members 51 and the parallel elements heating at the same time are arranged symmetrically with respect to the center so as not to be adjacent to each other.

Figure 25:
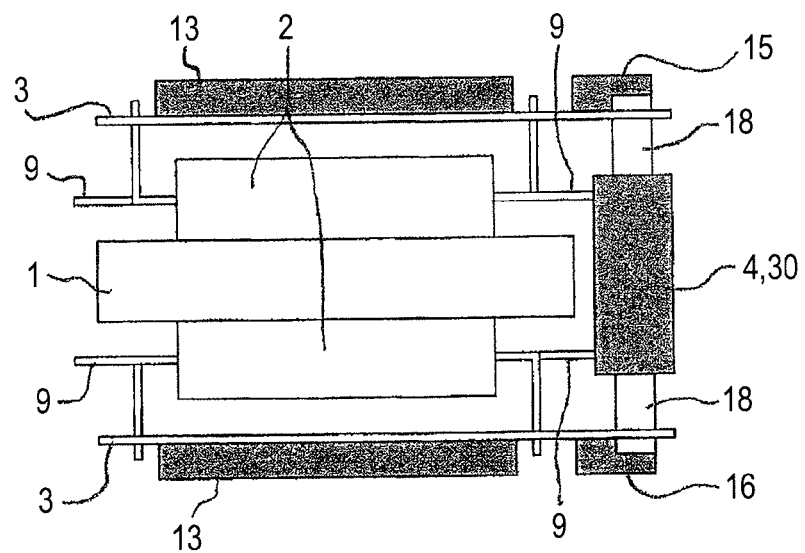
FIG. 25 is a side view illustrating another power unit according to the invention.

Also, as illustrated in FIG. 25, a driver circuit 13 that drives the opposing semiconductor modules 2 is mounted on a portion of each control board 3 opposite to each semiconductor module 2. The output control circuit 15 having a function of controlling an output of the power converter according to signals from various sensors attached to the load and the current detector 30, and transmitting a switching timing signal to the respective driver circuits 13 is mounted on a portion of one control board 3 opposite to the current detector 30. The power supply circuit 16 for operating the output control circuit 15 and all the driver circuits 13 is mounted on a portion of the other control board 3 opposite to the current detector 30, and those circuits configure a control circuit of the power converter.

Figure 28A:
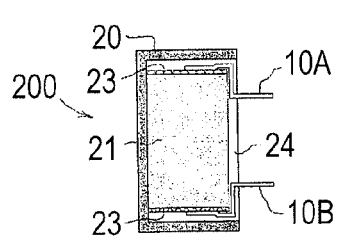
FIG. 28A is a cross-sectional view of a smoothing capacitor according to the second embodiment.
Figure 28B:
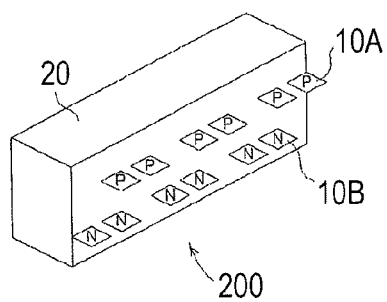
FIG. 28B is a perspective view of a contour of the smoothing capacitor.

According to this embodiment illustrated in FIG. 24, the semiconductor modules 2 of the positive pole side or the negative pole side are concentrated on one surface of the cooler 1. In the terminals arranged at two upper and lower stages on the terminal surface of the smoothing capacitor unit 200 in correspondence with the input and output terminals 9 of the semiconductor modules 2 arranged on both surfaces of the cooler 1, one line of terminals can be unified into the positive pole, and the other line of terminals can be unified into the negative pole. With this arrangement, as illustrated in FIG. 28, the insulation distance or the insulation member required when the positive and negative terminals come close to each other is not required without intersection of the positive pole P wiring and the negative pole N wiring inside or outside the smoothing capacitor unit 200. Thus, the smoothing capacitor unit 200 that occupies a large space in the power converter can be downsized, and the costs can be reduced.

Also, each of the semiconductor modules 2 at the positive pole side and the negative pole side is consolidated to one side of the cooler 1. This configuration is advantageous when a plurality of semiconductor elements is connected in parallel within one semiconductor module 2 to configure a large-capacity power converter. For example, two circuits each having the switching element 11 and the reflux diode 12 connected in inverse parallel are connected in series within one semiconductor module 2, and a semiconductor module 2 (2in1 type) undertaking one phase of the three-phase orthogonal power conversion circuit has already existed, which is used in the first embodiment as illustrated in FIG. 9. In this case, in order that the semiconductor modules 2 of the 2in1 type are disposed on both surfaces of the cooler 1, and the two semiconductor modules 2 arranged on both surfaces of the cooler 1 are connected in parallel to increase the capacity, there is a need to synchronize the driving timing of the semiconductor modules 2 arranged on both surfaces of the cooler 1. However, it is difficult to synchronously drive the semiconductor modules 2 connected in parallel between the driver circuits separately arranged, from the viewpoint of an operation delay time caused by a filter necessary for the connection portion between the control boards 3. In order to avoid this problem, the driver circuits for driving the two semiconductor modules 2 must be consolidated to one. In this case, because the control board 3 cannot be dispersed on both surfaces of the cooler 1, it is impossible that the semiconductor modules 2 and the smoothing capacitor unit 200 are connected to each other with the shortest length to decrease the inductance according to the configuration of the invention.

However, when the semiconductor modules 2 at the positive pole side and the negative pole side are dispersed on both surfaces of the cooler 1 as in the configuration of this embodiment, the respective driver circuits 13 at the positive pole side and the negative pole side can be consolidated on one surface of the cooler 1. Therefore, the division of the driver circuit 13 becomes unnecessary, and the capacity of the driver circuit 13 is easily increased. Also, a package of the semiconductor module of the 2in1 type according to the first embodiment illustrated in FIG. 9 is diverted, and two circuits each having the switching element 11 and the reflux diode 12 connected in inverse parallel within the semiconductor module 2 is changed from a series connection to a parallel connection. With this arrangement, the two-parallel large-capacity semiconductor modules (2 parallel 1in1 type) corresponding to the positive pole side or the negative pole side for one phase illustrated in FIG. 27 can be easily obtained. Therefore, even if large-capacity package is newly developed, a large-capacity semiconductor module can be obtained, and the development costs can be reduced.

Further, in the semiconductor modules 2 illustrated in FIG. 27, the semiconductor elements connected in parallel and heating at the same time are mounted on the different heat diffusion members 51, and arranged at places not adjacent to and apart from each other. Therefore, the semiconductor elements are hardly affected by respective heating, and a larger current can be applied to the semiconductor elements as compared with a case in which the semiconductor elements are arranged at the adjacent places. As a result, the reduction in the size, the weight, and the costs of the power converter can be performed with the downsized semiconductor element and the simplified cooler.

According to this embodiment illustrated in FIGS. 25 and 26, the driver circuits 13 of the semiconductor modules 2 that operate, independently, are dispersed to the two control boards 3, and disposed to face the respective semiconductor modules 2 to be driven. On the other hand, one output control circuit 15 that integrally controls all of the semiconductor modules 2 is required for one power conversion function, and it is difficult to divide the output control circuit 15. Therefore, there is a need to consolidate the output control circuit 15 to one control board 3.

For example, in the orthogonal power converter for driving the motor, a switching time of the respective phase semiconductor modules for driving the motor is determined according to positional information from a rotor position detector of the motor, and current information from an output current detector of the power converter. The determined switching timing is transmitted to the driver circuits of the respective semiconductor modules, and the semiconductor elements operate to control the motor output. Taking those functions into consideration, it is desirable that the output control circuit 15 is arranged at a position as close as the driver circuit 13, the current detector 30 and the motor 32 from the viewpoints of the noise resistance, the response, and the space efficiency. According to this embodiment, the output control circuit 15 comes close to the current detector 30, and can receive a signal from the current detector 30 with the shortest length. Also, according to this embodiment, the current detector 30 is a current detector that detects an output current to the motor. Taking the efficient arrangement between the devices into consideration, the current detector 30 is arranged at a position close to the motor to be controlled by the output control circuit 15. As a result, the output control circuit 15 is so positioned as to receive a sensor signal from the motor to be controlled with the shortest distance, and the output control circuit 15 can be arranged at the best position from the viewpoints of the noise resistance, the response, and the space efficiency. The output control circuit 15 and the driver circuit 13 mounted on another control board 3 are connected to each other by the wiring provided in the current detector 30 for connecting the respective control boards 3 to each other, without any connector or harness, that is, with the shortest distance. In the configuration of this embodiment, even if the control circuit that realizes one power conversion function is dispersed to the plurality of control boards 3, the excellent output control and driving of the semiconductor modules 2 can be performed by the connection function between the control boards provided in the current detector 30.

Also, the driver circuits 13 are arranged at positions facing the respective semiconductor modules 2 to be driven. The output control circuit 15 is consolidated to one control board 3, and a space exists at a portion of the other control board 3 opposite to the current detector 30. In the embodiment illustrated in FIGS. 25 and 26, the space is used to mount a power supply circuit 16 necessary for driving the driver circuits 13 and the output control circuit 15. In the power converter configured as illustrated in FIG. 26, because the semiconductor module 2 is different in potential as a reference among the respective phases, an insulated power supply is necessary for driving the semiconductor module 2 for each phase. The wirings connecting between the power supply circuit 16 and the driver circuits 13 need to be insulated among the respective phases. When the power supply circuit 16 and the driver circuits 13 are divided and arranged on the different boards, there is a need to extend the insulation required power supply line between the boards. In order to ensure a necessary insulation distance, a large-sized connector thinning the connection pins is used, a harness of a high withstand voltage is necessary, leading to a remarkable increase in the size and costs. When there is no large-sized connector mounted place for power supply, there is a method in which the power supply circuit 16 is divided into two in the same manner as that of the driver circuit 13. In this case, because two sets of expensive power supply control system parts and large-sized insulation transformers are required, the size and the costs are problematic. However, this embodiment has a power supply line connection function between the control boards 3, which is originally necessary for the power converter, easy to ensure the insulation distance sufficiently larger than that of the connector, and dispersed to the current detector 30. No additional space is required, and the power supply between the control boards 3 can be realized.

Figure 29:
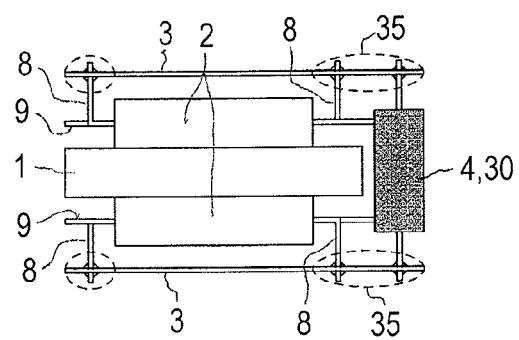
FIG. 29 is a side view illustrating another power module according to the invention.
Figure 30:
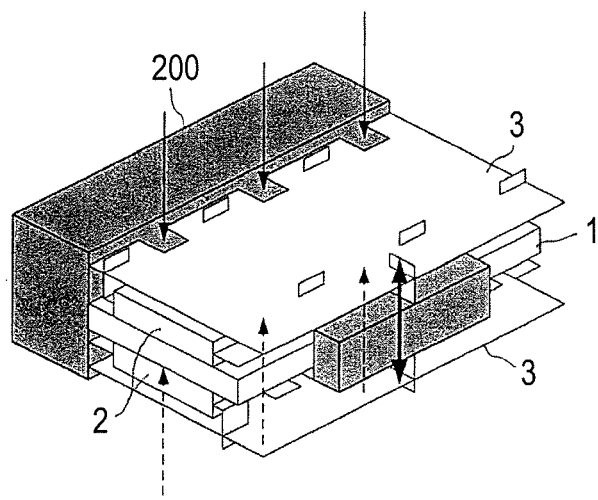
FIG. 30 is a perspective view illustrating the smoothing capacitor unit and the power module according to the second embodiment.

Subsequently, the connection configuration of the semiconductor module, the control circuit, and the smoothing capacitor unit according to the second embodiment of the invention will be described in detail with reference to FIGS. 29 and 30. First, as illustrated in FIG. 30, notches are formed at portions of the control board 3, which face places where the semiconductor modules 2 and the smoothing capacitor unit 200 are connected to each other. As illustrated in FIG. 29, the control board 3 and the control terminals 8 of the semiconductor modules 2, and the control board 3 and the wiring of the current detector 30 are configured by inserting pins provided at the semiconductor modules 2 and the current detector 30 side into through-holes provided in the control board 3, and soldering 35.

In the power converter illustrated in FIG. 29, because the soldered portions 35 between the control boards 3 and the semiconductor modules 2, and between the control boards 3 and the current detector 30 exist on both surfaces of the cooler 1, it is necessary that after soldering is conducted for one surface, a product rotates by 180 degrees, and soldering is conducted for the other surface. In this situation, when the smoothing capacitor unit 200 and the semiconductor modules 2 are connected to each other in advance, the entire smoothing capacitor unit 200 of heavy weight needs to rotate. Therefore, the weight and size of the power converter are increased, and a jig necessary for manufacturing becomes ambitious in order to firmly connect the cooler 1 to the smoothing capacitor unit 200. As a result, there is a risk that the manufacturing costs increase. There is a method in which the terminal of each semiconductor module 2 extends to the outside of a projected area of the control board 3, and the semiconductor modules 2 and the smoothing capacitor unit 200 are connected to each other at a portion that is not affected by soldering the semiconductor modules 2 and the control board 3 in advance. However, in this case, the wiring inductance becomes large, and the switching surge suppression is necessary, and it is difficult to downsize the power converter and enhance the efficiency. Under the circumstance, in this embodiment illustrated in FIG. 30, the fastening portions of the semiconductor modules 2 and the smoothing capacitor unit 200 are notched, and the control board 3, the current detector 30, and the semiconductor modules 2 are connected to each other by soldering 35 in advance. Thereafter, the smoothing capacitor unit 200 and the semiconductor modules 2 are connected to each other by the notches. With this configuration, the increase in the weight, the size, and the loss of the power converter can be prevented. However, the effective area of the control board 3 is reduced. However, according to this embodiment, the current detector 30 is arranged to be low in the height, and the control boards 3 extend up to the surface facing the current detector 30 without upsizing the power converter. Therefore, the sufficient effective area which is large in the mounted surface can be ensured.

Figure 31:
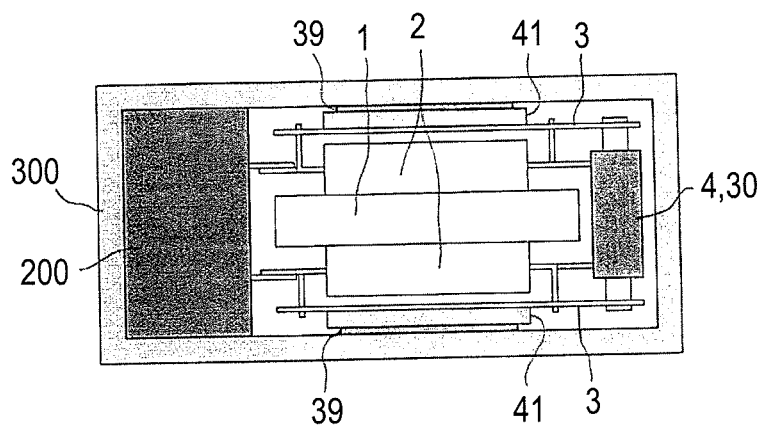
FIG. 31 is a side sectional view illustrating the power converter according to the second embodiment.
Figure 32:
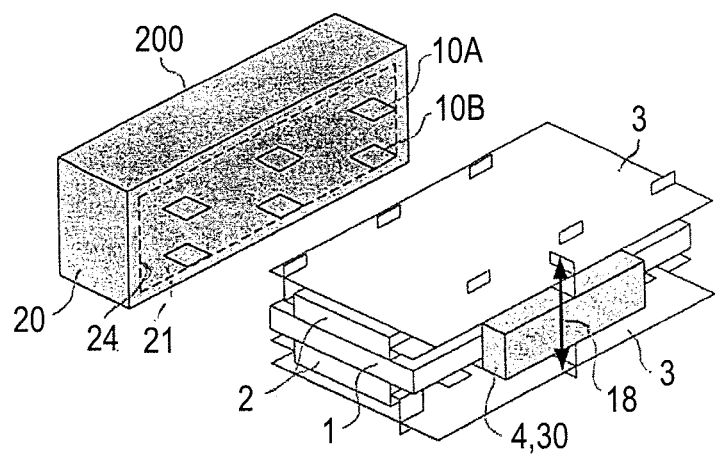
FIG. 32 is an exploded perspective view illustrating the smoothing capacitor unit and the power module according to the second embodiment.
Figure 33:
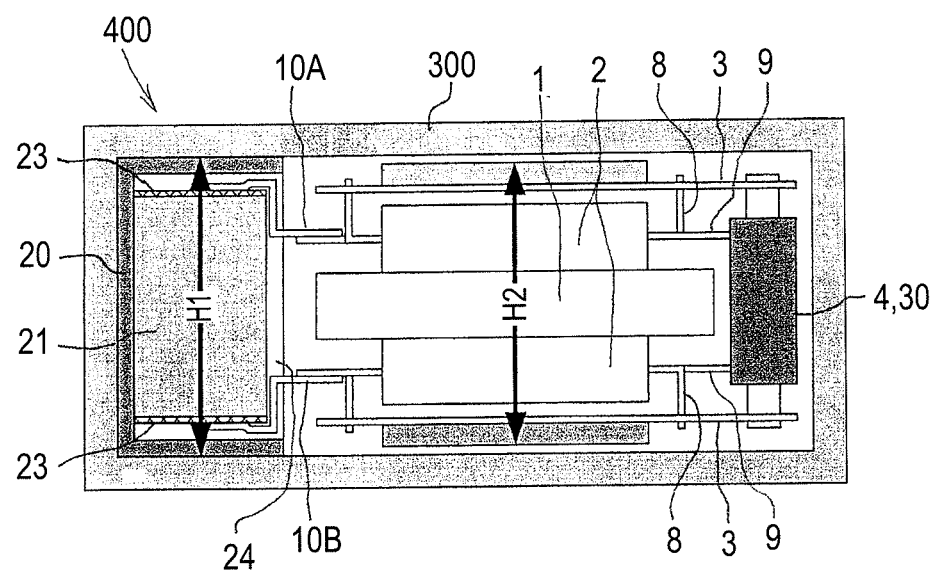
FIG. 33 is a side sectional view illustrating the power converter according to the second embodiment.

Subsequently, the details of the smoothing capacitor unit according to the second embodiment of the invention will be described with reference to FIGS. 31 to 34. The smoothing capacitor unit 200 includes capacitor elements 21, a capacitor case 20 that protects the capacitor elements 21 and connects with the housing, and the capacitor terminals 10A, 10B that connect the capacitor elements 21 and the semiconductor modules 2. Each capacitor element 21 is a film capacitor formed in such a manner that after a PP film is wound, and the element is flattened by pressing, both ends are subjected to a terminal extracting process to provide an electrode surface 23. As illustrated in FIG. 33, a plurality of electrode surfaces 23 is disposed substantially in parallel to the semiconductor module 2 mounted surface of the cooler 1. A plurality of capacitor elements 21 are connected in parallel by the capacitor terminals 10A and 10B, and connected directly to the plurality of semiconductor modules 2. As illustrated in FIG. 32, the capacitor case 20 has an opening portion 24 at a side surface that faces the cooler 1. After the capacitor elements 21 and the capacitor terminals 10A, 10B are stored in the opening portion 24, the opening portion 24 is sealed with a resin material.

Figure 34:
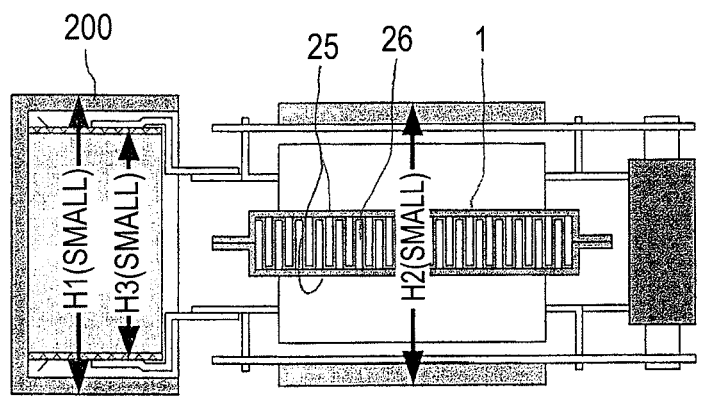
FIG. 34 is a side sectional view illustrating the smoothing capacitor unit and the power assembly according to the second embodiment.

The height (a length of the capacitor elements) of the capacitor case 20 is substantially the same as that of the respective maximum inter-parts distance mounted on the two control boards 3 facing both surfaces of the cooler 1. In this embodiment, as illustrated in FIG. 31, a displacement absorbable gelled high thermal conduction insulating sheet 39 which is slightly thicker than a gap produced by the difference is disposed between parts 41 mounted on the control boards 3 and the housing 300 to ensure insulation between the parts 41 on the control board 3 and the housing 300 while radiating the heat of the control boards 3. With this arrangement, the smoothing capacitor unit 200, the control boards 3, and the semiconductor modules 2 and the cooler 1, which are held between the control boards 3, form a substantially rectangular solid. As illustrated in FIG. 34, in the cooler 1 that cools the semiconductor modules 2, a thin semiconductor module mounted plate 25 and a cooling fin 26 high in density and large in radiation area are manufactured as different parts to configure the thin cooler 1. With this configuration, an overall length of the capacitor element 21 is shortened.

In the embodiments illustrated in FIGS. 30, 31, and 33, the smoothing capacitor unit 200 is disposed to face a surface of the cooler 1, which does not contact the semiconductor modules 2, to thereby utilize the thickness of the cooler 1 as an installation space of the smoothing capacitor unit 200. As a result, as compared with a case in which the smoothing capacitor unit 200 is arranged on a surface of the cooler 1, which contacts with the semiconductor modules 2, as disclosed in JP-A-2005-12940, the power converter is downsized and lowered in height. Also, when the opening portion 24 of the capacitor case 20 is arranged to face the surface of the cooler 1, which does not contact the semiconductor modules 2, thereby making the capacitor terminals 10A and 10B shortest. Thus, an electric connection distance between the capacitor element 21 and the semiconductor modules 2 can be minimized, and the wiring inductance can be reduced without provision of a parallel plate in which the positive terminal and the negative terminal come close to each other through the insulating material as in the smoothing capacitor disclosed in JP-A-2005-12940. For that reason, the downsizing and the cost reduction can be performed by deletion of the members. Also, the addition of a snubber that adversely affects the downsizing and the high efficiency, and surge suppression such as a reduction in the switching speed are not required whereby the power converter can be downsized, and the costs can be reduced.

As illustrated in FIG. 31, when the height of the smoothing capacitor unit 200 is made slightly higher than a distance between the highest surfaces of the parts 41 mounted on the two control boards 3, all of the heights of the parts including the smoothing capacitor unit 200, the control board 3, and the current detector 30 or the terminal block 4 can substantially match each other. Therefore, the power converter can be downsized without a useless space. With the provision of the slight gap, a slight gap is formed between the parts 41 (power receiving unit is exposed) mounted on the control board 3 and the housing 300, and an air flow caused by convection is ensured in the vicinity of the parts 41 by the gap, and the parts 4 mounted on the control board 3 can be set to a permissible temperature or lower. However, in order to downsize the power converter, it is desirable that the gap distance is set to the shortest distance that can ensure insulation obtained by the power converter, or lower than the shortest distance with the use of another insulating member such as an insulating sheet. Under the circumstance, in this embodiment, the insulation between the parts 41 on the control board 3 and the housing 300, and radiation of the parts 41 are realized by the high thermal conduction insulating sheet 39 of insulation having a thickness that can absorb the displacement of a height caused by variations of the parts or assembly. The power converter can be downsized.

The wiring inductance can be reduced by reducing the overall length of the capacitor element 21. In the case of the capacitor element 21 ensuring the same capacity, when the overall length is shortened, the area of the electrode surface must be increased. However, there is advantageous in that heating is decreased more as the area of the electrode surface (equivalent to the sectional area S of the wiring path) is larger, and the overall length, that is, the distance between the electrode surfaces (path length L of the wiring path) is shorter (like the resistance value of the electric wiring $R=\rho \times L \div S$, the resistance is smaller and the Joule heat is smaller as the sectional area of the capacitor element is larger, and the wiring path length is shorter). In the power converter according to this embodiment, a distance between the parts 41 on the control board 3 and the housing 300 is made shorter, or as illustrated in FIG. 34, the cooler 1 is thinned so that the overall length (distance between the electrode surfaces: H3) of the capacitor element 21 is reduced. Since the heating of the smoothing capacitor unit 200 is small, and a large permissible ripple current is taken, the smoothing capacitor unit 200 can be downsized. The smoothing capacitor unit 200 constitutes a major percentage in volume and weight in the power converter, and the downsizing of the smoothing capacitor unit 200 leads to the remarkable reduction in the size and weight of the power converter and the reduction in the costs.

Third Embodiment

Subsequently, a configuration according to a third embodiment of the invention will be described. The power converter according to the third embodiment is an example in which the switching element mounted on the semiconductor module according to the second embodiment is replaced with a wideband gap element. In the wideband gap element such as SiC, because the high temperature operation and the high speed switching are enabled, the heat resistance and the noise resistance of the peripheral parts are problematic. In this embodiment, a configuration for improving the heat resistance and the noise resistance of the peripheral parts will be described on the basis of the power converter according to the second embodiment. This embodiment is applied to not only the wideband gap element, but also the power converter according to the first and second embodiments.

Figure 35:
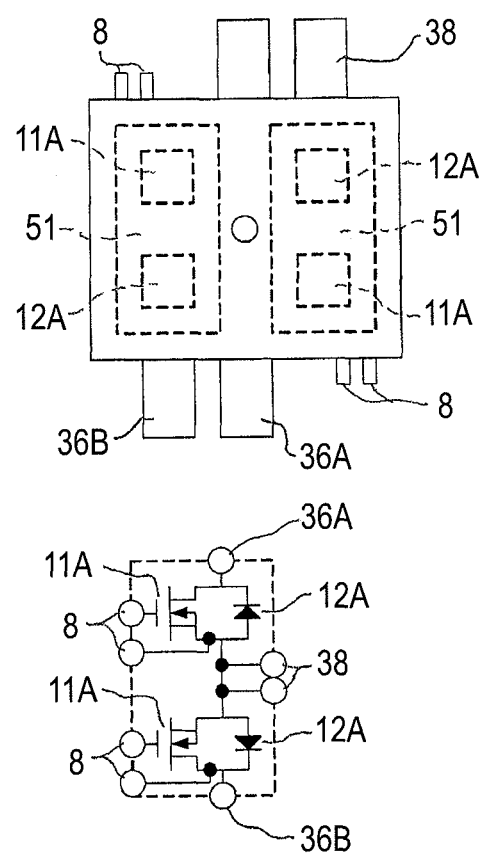
FIG. 35 is a diagram illustrating a contour and a circuit configuration of a semiconductor module in another power converter according to the invention.

The basic configuration according to the third embodiment of the invention will be described with reference to FIGS. 35 to 37. The basic configuration of the semiconductor modules 2 according to this embodiment is identical with that of the second embodiment. As illustrated in FIG. 35, as the switching element 11A, two circuits each consisting of an MOSFET made of SiC and a Schottky barrier Di made of Sic are connected in parallel. At the same time, in order to avoid the temperature rising due to thermal interference between the parallel elements that heat at the same time, the parallel elements are mounted on the different heat diffusion members 51 and the parallel elements heating at the same time are arranged symmetrically with respect to the center so as not to be adjacent to each other. The layout of the terminals is identical with that in the second embodiment. In this embodiment, the semiconductor element mounted on the semiconductor modules 2 is exemplified by the SiC semiconductor element. However, it is not always necessary that the semiconductor element is made of SiC. The semiconductor element may be a semiconductor element made of Si, a GaN element which is a wideband gap element like Sic, or a wideband gap element made of diamond as a raw material. Also, the combination of the MOSFET and the Schottky barrier Di may be replaced with the combination of the IGBT and a reflux diode.

At the present, only the semiconductor element made of SiC smaller in size than the semiconductor element made of Si is commercialized. A plurality of elements needs to be connected in parallel in use. In addition, an on threshold voltage is lower than that of the semiconductor element made of Si, and there is a possibility that the semiconductor element erroneously turns on due to noise unless a negative bias is applied to the semiconductor element when the semiconductor element is off. Thus, the scales of the driver circuit and the power supply circuit using the SiC semiconductor elements tend to be larger than those using the Si semiconductor elements at the present. The power converter illustrated in FIGS. 36 and 37 is an example in which the invention is applied to the power converter which is large in the circuit scale. The basic layout configurations of the semiconductor modules 2, the cooler 1, the smoothing capacitor unit 200, and the two control boards 3 arranged to face the semiconductor modules 2 are identical with those in the second embodiment. In this embodiment, a third control board 3A is newly added.

In the second embodiment, the driver circuit 13 for the semiconductor modules 2 facing the first control board 3, and the power supply circuit 16 for the first and second control boards 3 are mounted on the first control board 3, and the driver circuit 13 for the semiconductor modules 2 facing the second control board 3, and the output control circuit 15 are mounted on the second control board 3. On the other hand, in this embodiment, only the driver circuits 13 for the semiconductor modules 2 facing the respective control boards are mounted on the first and second control boards 3. The output control circuit 15 and the power supply circuit 16 are arranged on a third control board 3A newly provided. As illustrated in FIG. 37, in the first and second control boards 3, the layout of the connection portions with the semiconductor modules 2, the fixed portions with the cooler 1, and the positions of the wirings 18 provided in the current detector 30 and connecting between the control boards 3 are identical between the first control board 3 and the second control board 3. The second control board 3 has a notch 48B for avoiding interference with a connection wiring extending from the first control board 3 to the third control board 3A through the current detector 30. The first control board 3 also has a notch 48A at the same position.

This embodiment is identical with the second embodiment in that the respective control boards are electrically connected to each other by the wiring 18 that is provided in the current detector 30 disposed between the first and second control boards 3, and connects between the control boards. On the other hand, this embodiment is different from the second embodiment in that the driver circuit 13 for the first and second control boards 3, and the output control circuit 15 and the power supply circuit 16 for the third control board 3A are connected to each other by wirings 28 and 29 that are provided in the current detector 30 and connect between the control boards.

Figure 36:
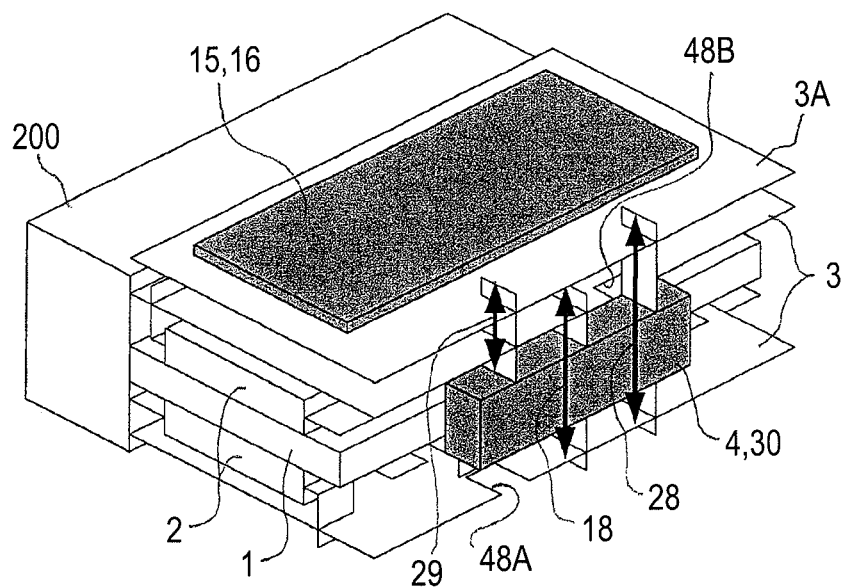
FIG. 36 is a perspective view illustrating a smoothing capacitor unit and a power assembly according to a third embodiment of the invention.
Figure 37:
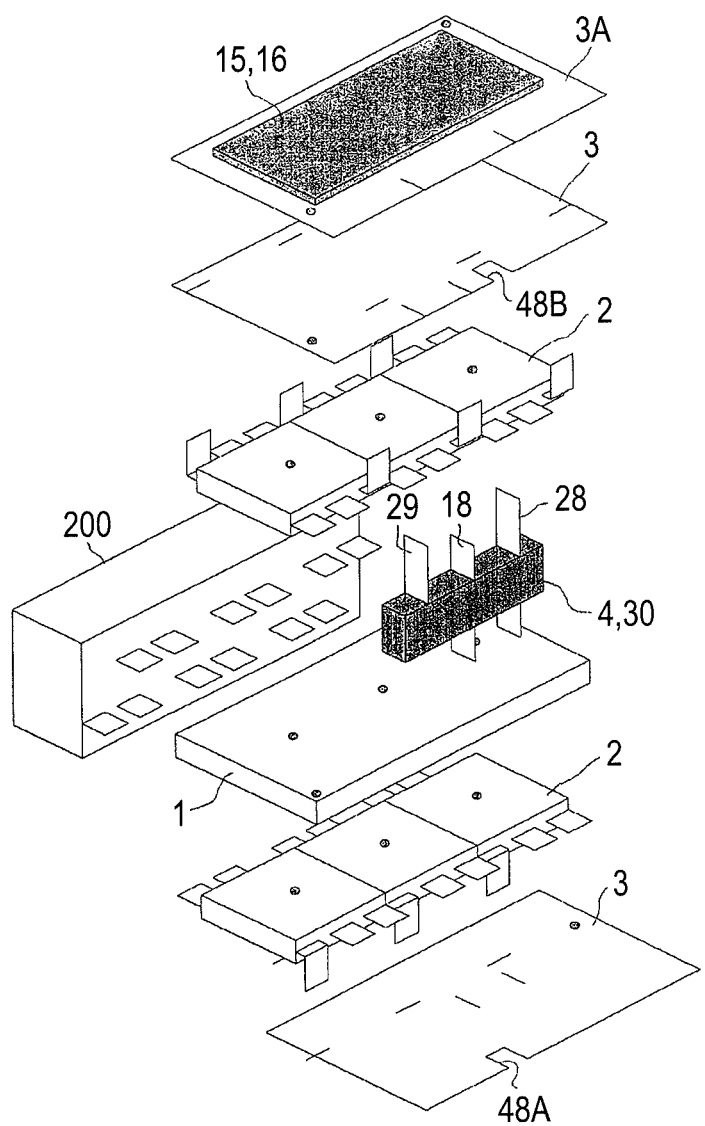
FIG. 37 is an exploded perspective view illustrating a basic configuration of a power converter according to the third embodiment.

In this embodiment illustrated in FIGS. 36 and 37, the control board 3A on which the output control circuit 15 and the power supply circuit 16 are mounted is newly added. As in this embodiment, when the circuit scales of the output control circuit 15 and the power supply circuit 16 are large, or when the semiconductor modules 2 are very small in size, and the driver circuits 13 cannot be placed on a portion facing the semiconductor modules 2 as another example, the output control circuit 15 and the power supply circuit 16 are mounted on the portions of the first and second control boards 3, which face the current detector 30, as in the second embodiment. As a result, an influence of upsizing of the portion facing the current detector 30 is larger than an influence of an increase in the thickness due to the addition of the third control board. This may make it difficult to downsize the power converter. In this case, the third control board 3A is provided, the output control circuit 15 and the power supply circuit 16 are mounted on the third control board 3A, and the shape of the smoothing capacitor unit 200 is optimized according to an increase in the height of the power converter. As a result, the downsized power converter can be configured as in the second embodiment, without increase in the entire volume while the floor area of the power converter is reduced. In this case, it is necessary that the switching timing signal from the output control circuit 15 to the driver circuits 13 is transmitted from the third control board 3A to the first and second control boards 3. Also, it is necessary that an insulated power is supplied from the power supply circuit 16 to the driver circuits 13. As in the second embodiment, when those members are connected by the wiring provided in the current detector 30 and connecting between the control boards, those connections can be realized without using the connector and the harness which cannot prevent upsizing of the power converter for insulation and high withstand voltage securement. The power converter can be reduced in the number of parts, and downsized.

The first control board 3 and the second control board 3 have only the function of driving the semiconductor modules 2 facing the respective control boards 3. The respective functions are identical, and only the connections with the target semiconductor modules 2, the power supply circuit 16, and the load are different. Therefore, as illustrated in FIG. 37, the layout of the fixed structure is devised, notches are formed in the contours of the first control board 3 and the second control board 3, and the wiring layout of the current detector 30 is conducted as illustrated in FIG. 37 to commonalize the control boards 3. When the first and second control boards 3 can be commonalized, the number of managing man-hours of the parts is reduced, and a labor for changing setup of facility for manufacturing various models in a control board manufacturing process is reduced. Therefore, the costs can be reduced.

Figure 38:
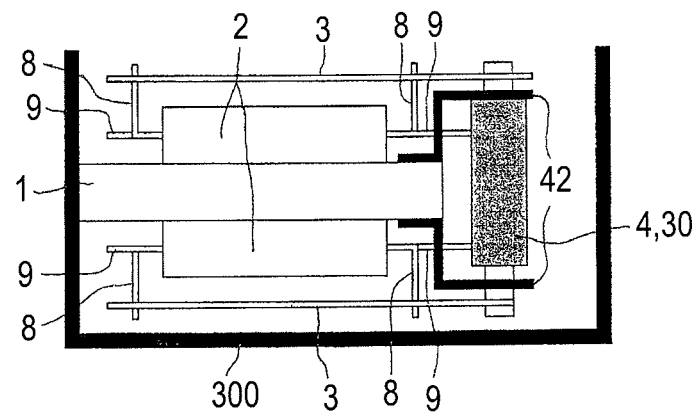
FIG. 38 is a side view illustrating a positional relationship of a current detector holding bracket according to the invention.

Subsequently, the countermeasures against heat and noise according to the third embodiment of the invention will be described in detail with reference to FIGS. 25 and 38 to 41. As illustrated in FIG. 38, the current detector 30 according to this embodiment is fixed to the cooler 1 fixed with the housing 300 by a metal bracket 42. The metal bracket 42 is bent in the vicinity of an end surface of the cooler 1, and disposed between the control board 3 and the current detector 30.

Figure 39:
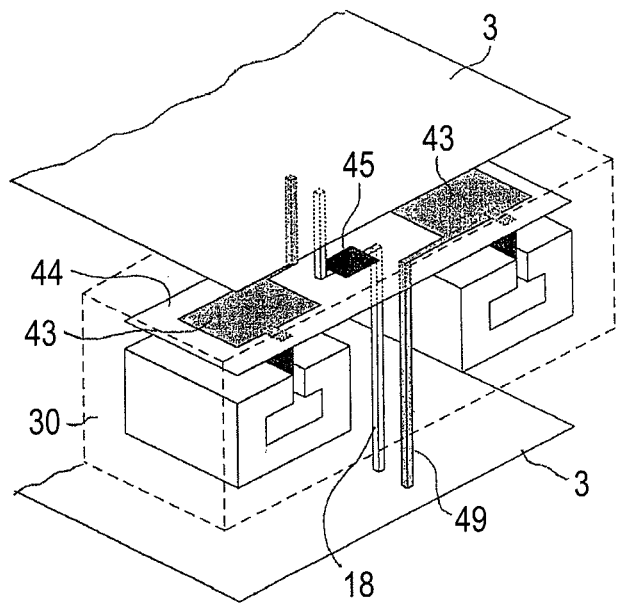
FIG. 39 is a perspective view illustrating an internal configuration of a current detector into which noise suppression parts are integrated according to the invention.

As illustrated in FIG. 39, the current detector 30 is equipped with a current detection board 44 on which a current detector circuit 43 is mounted. The current detection board 44 is provided with the wiring 18 that connects between the two control boards 3 arranged to face both surfaces of the cooler 1, and a noise suppression parts 45 is mounted on the middle of the wiring. The control boards 3 and the current detector circuit 43 are connected to each other by a wiring 49.

The output control circuit 15 and the power supply circuit 16 are mounted on a portion of the control boards 3 opposite to the metal bracket 42. An insulating circuit disposed between the output control circuit 15 and the driver circuits 13 is also mounted thereon. The insulating circuit is formed of a photo coupler which is an insulating element due to light transmission for insulating a signal between the output control circuit 15 that operates with a low-voltage control power supply and the driver circuit 13 that operates with a main circuit voltage reference which is the same voltage as that of the semiconductor element. The photo coupler is lower in the highest use temperature than surrounding semiconductor electronic parts because the photo coupler is of a specific package configuration for optical transmission (the highest use temperature of the semiconductor electronic parts is frequently 105 to 125° C. whereas the highest use temperature of the photo coupler is frequently 85 to 105° C.). The output control circuit 15 includes a voltage detector circuit for detecting the main circuit voltage of the power converter, divides the main circuit voltage by a voltage divider circuit using high precision resistor elements within the voltage detector circuit, and inputs the divided voltage to an arithmetic device (CPU) within the output control circuit 15. The power supply circuit 16 is equipped with an insulation transformer for insulating the driver circuit power supply of the respective semiconductor modules 2. The insulation transformer is subjected to high-density winding for downsizing the control board 3. That is, the photo coupler lower in the highest use temperature than the surrounding parts, the high precision resistor elements in which the characteristic change due to temperature is problematic, and the insulation transformer that becomes high in temperature because of the high-density winding are mounted on a portion of the control board 3 opposite to the metal bracket 42.

Figure 41:
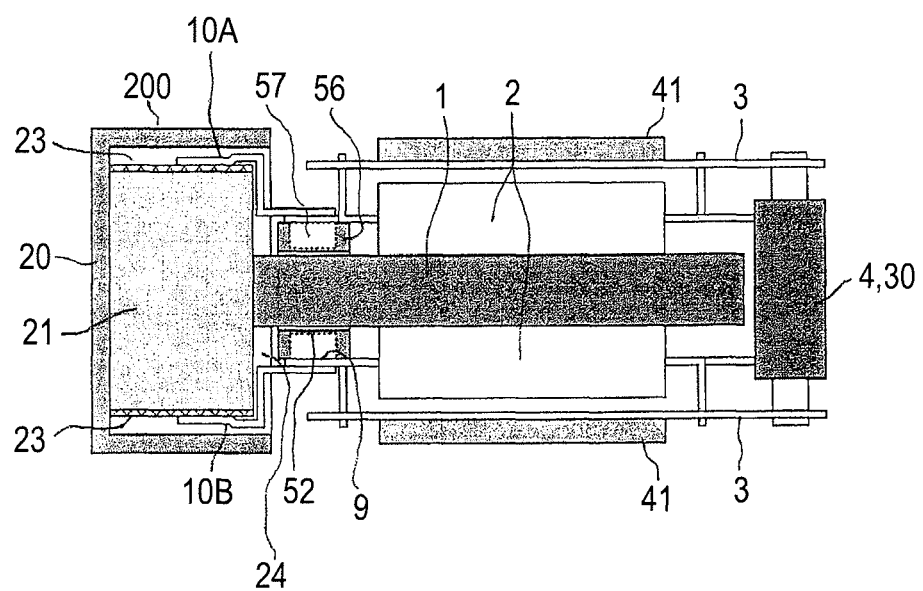
FIG. 41 is a side sectional view illustrating a configuration in which the smoothing capacitor unit is cooled according to the second embodiment.

As illustrated in FIG. 41, the smoothing capacitor unit 200 includes the capacitor element 21, the capacitor case 20 for protecting the element and connecting with the housing, and the capacitor terminals 10A and 10B for connecting the capacitor element 21 to the semiconductor modules 2. The capacitor element 21 is formed of a film capacitor in which a PP film is wound, and the electrode surface 23 formed on both ends of the capacitor element 21 are arranged substantially in parallel to surfaces on which the cooler 1 contacts the semiconductor modules 2. Further, the opening portion 24 of the capacitor case 20 in the smoothing capacitor unit 200 faces the cooler 1, and a part of the cooler 1 extends so that a side surface of the capacitor element 21 substantially in the center thereof contacts the cooler 1 through a potting resin and a high thermal conduction adhesive not shown. Also, the connection of the capacitor terminals 10A, 10B and the input and output terminals 9 of the semiconductor modules 2 is fastened with the use of a high thermal conduction resin terminal block 56 fixed to the cooler 1 through a high thermal conduction adhesive 52, by screws and metal connection members 57 built in the terminal block 56.

Each of the semiconductor modules 2 according to this embodiment is formed of an SiC-MOSFET and an SiC-SBD which are wideband gap element 11A. The wideband gap element 11A made of SiC can be driven at a higher speed than the related-art Si element. Therefore, when the wideband gap element 11A is driven at the high speed with taking this advantage, the malfunction of the control circuit due to noise is problematic. In this embodiment, because a small signal is dealt with by weaker current driving than that of the driver circuits 13, the output control circuit 15 relatively weak in the noise is mounted on a portion opposite to the current detector 30 as illustrated in FIG. 25. As illustrated in FIG. 38, in the portion opposite to the current detector 30, the metal bracket 42 (grounded to the housing 300 through the cooler 1) that holds the current detector 30 is arranged close to the control boards 3 so as to shield noise from the high voltage wiring. As compared with a portion immediately above the semiconductor modules 2, an influence of noise is small, and the possibility of malfunction is low. The wirings 18 integrated in the current detector 30 between the control boards 3 cannot enjoy the shield effect of the metal bracket 42. However, as illustrated in FIG. 39, the noise suppression parts are mounted on the current detection board 44 (grounded to the housing through the bracket and the cooler) for countermeasures.

Also, the semiconductor modules 2 according to this embodiment are formed of an SiC-MOSFET and an SiC-SBD which are wideband gap element 11A. The wideband gap element 11A made of SiC is higher in heat resistance than the related-art Si element, and for taking this advantage, a high temperature (for example, 175 to 225° C.) exceeding the highest element temperature 125 to 175° C. of the related-art Si element is frequently used. The heating of the semiconductor element is cooled by the cooler 1, which may cause an increase in temperature of the package of the semiconductor modules 2, or an increase in temperature of the surrounding control board 3 through the terminals.

Figure 40:
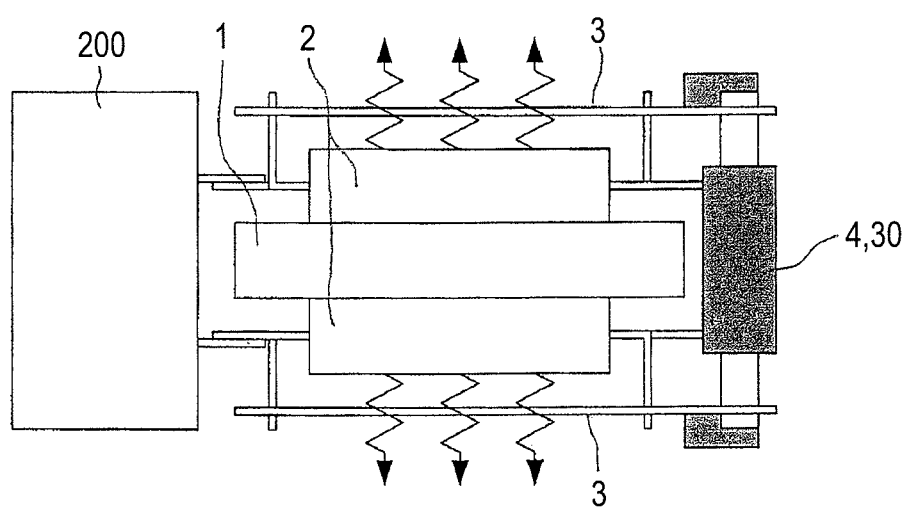
FIG. 40 is a side view illustrating the smoothing capacitor unit and the power assembly in the case of applying an element made of silicon nitride, a gallium nitride material or diamond according to the second embodiment.

In this embodiment illustrated in FIG. 40, the photo coupler that is a heat weak parts low in the highest use temperature is mounted on a portion not opposite to and apart from the semiconductor modules 2 on which the SiC element that becomes higher in temperature than that in the related art is mounted, and on a portion thermally insulated from the input and output terminals 9 by the metal bracket 42 connected to the cooler 1 as illustrated in FIG. 38. The insulating circuit can be configured by the photo coupler widely spread up to now without using specific insulating parts of high heat resistance, and therefore the costs of the power converter can be reduced. Also, when the voltage detector circuit is influenced by the surrounding temperature, the precision is affected. Therefore, although the number of heat weak parts is one, this circuit is mounted on a portion not opposite to and apart from the semiconductor modules 2 on which the Sic element is mounted, and mounted on a portion thermally insulated by the metal bracket 42 connected to the cooler 1. Thus, the deterioration of the precision due to the increase in the surrounding temperature is low, and high-precision control is enabled. Also, the insulation transformer mounted on the power supply circuit 16 is largely heating parts that becomes high temperature like the switching element and the arithmetic device (CPU) of the output control circuit 15 mounted on the same power supply circuit 16. The power supply circuit 16 including those circuits is mounted on a portion not opposite to and apart from the semiconductor modules 2 on which the Sic element is mounted, and mounted on a portion thermally insulated from the input and output terminals 9 by the metal bracket 42 connected to the cooler 1. With this configuration, because the largely heating parts can be downsized, and an area of the radiation pad provided on the control board 3 can be reduced, an increase in the size of the power converter can be suppressed and further downsizing can be performed.

Also, not only the control board 3 but also the smoothing capacitor unit 200 using an organic PP film weak in high temperature is one of the heat weak parts. However, as illustrated in FIG. 41, a side surface of the cooler 1 extends, and substantially the center of the capacitor element 21 is cooled. Also, heat transfer from the capacitor terminals 10A and 10B to the capacitor element 21 is prevented by the resin terminal block 56 having a function of radiating the heat of the terminals to the cooler 1. The ripple current per unit capacity is increased to reduce the size and weight of the smoothing capacitor unit, and realize the reduction in the size and weight of the power converter. Like the second embodiment, in this embodiment, the semiconductor modules 2 at the positive pole side and the negative pole side are dispersed on both surfaces of the cooler 1. Therefore, the terminals are not arranged on the side surfaces of the cooler 1, and a large contact area of the cooler 1 and the capacitor element 21 is obtained. Therefore, the power converter can be reduced in size and weight as compared with the other main circuit configuration and layout.

It should be understood that the embodiments described herein are merely exemplary of the preferred practice of the invention and that various changes, modifications, and variations may be made in the arrangements, operations, and details of construction of the elements disclosed herein without departing from the spirit and scope of the invention, as defined in the appended claims.

What is claimed is:

1. A power converter comprising:
semiconductor modules each having a semiconductor element mounted thereon;
a cooler for cooling the semiconductor modules;
control boards that control the semiconductor modules; and
a current detector that detects one of an input current and an output current of the semiconductor modules,
wherein the semiconductor modules are arranged on both surfaces of the cooler,
wherein the current detector is arranged to face a surface of the cooler, which is not in contact with the semiconductor modules,
wherein at least two of the control boards are arranged to hold the cooler, the semiconductor modules, and the current detector therebetween, and
wherein the current detector has a wiring that electrically connects between the control boards.

2. The power converter according to claim 1, further comprising: a metal bracket having one end fixed to the cooler, and the other holding the current detector,
wherein the end of the metal bracket which holds the current detector is positioned between the current detector and the control boards facing the current detector.

3. The power converter according to claim 1,
wherein a current detection board having a current detection function is disposed within the current detector, at least a part of wirings that is disposed in the current detector and connects between the respective control boards is formed on the current detection board, and a noise suppression parts is connected to the wiring formed on the current detection board.

4. A power converter comprising:
semiconductor modules each having a semiconductor element mounted thereon;
a cooler for cooling the semiconductor modules;
control boards that control the semiconductor modules; and
an input or output terminal block for connecting an input wiring or an output wiring, which is connected to the semiconductor modules, to an external wiring of the power converter,
wherein the semiconductor modules are arranged on both surfaces of the cooler,
wherein the terminal block is arranged to face a surface of the cooler, which is not in contact with the semiconductor modules,
wherein at least two of the control boards are arranged to hold the cooler, the semiconductor modules, and the terminal block therebetween, and
wherein the terminal block mechanically holds at least two of the control boards, and has a wiring that electrically connects between the respective control boards.

5. The power converter according to claim 4,
wherein the terminal block includes bus bar wirings connected to terminals of the semiconductor modules,
wherein a part of the bas bar wirings is arranged integrally with the terminal block so as to come close to the control boards,
wherein a magnetic detection element is disposed on a portion of the control boards, which comes close to the bas bar wiring, and
wherein the magnetic detection element and the bas bar wirings form a current detector.

6. The power converter according to claim 1,
wherein driver circuits that drive the semiconductor modules are provided on portions of the control boards opposite to the semiconductor modules,
wherein an output control circuit that operates the semiconductor modules and controls an output of the power converter is provided on a portion of the control boards opposite to the current detector or the terminal block, and
wherein the respective driver circuits or the driver circuits and the output control circuit are connected by a wiring that is disposed on the current detector or the terminal block, and electrically connects between the control boards.

7. A power converter, comprising:
semiconductor modules each having a semiconductor element mounted thereon;
a cooler having front and rear surfaces on which one of the semiconductor modules are mounted on each surface for cooling the semiconductor modules;
a first control board disposed to face one of the semiconductor modules;
a second control board disposed to face the other semiconductor modules;
a third control board disposed to face an opposite surface of the surface of the second control board opposite the semiconductor modules; and
one of a current detector and a terminal block disposed to face a surface of the cooler, which is not in contact with the semiconductor modules, and detects one of an input current and an output current of the semiconductor modules,
wherein driver circuits that drive the semiconductor modules opposite to the respective control boards are mounted on the first control board and the second control board,
wherein an output control circuit that operates the semiconductor modules and controls an output of the power converter is mounted on the third control board, and
wherein wirings that electrically connect among the respective control boards is provided in the current detector or the terminal block.

8. The power converter according to claim 1,
wherein the connection between the wirings that electrically connect among the respective control boards and provided in the current detector or the terminal block, and the control boards is the same as the connection of control terminals of the semiconductor modules and the control boards.

9. The power converter according to claim 1,
wherein parts lowest in the highest usable temperature, parts largest in heating, or both thereof among parts mounted on the control boards facing the semiconductor modules are mounted on a portion of the control boards opposite to the current detector or the terminal block.

10. The power converter according to claim 9,
wherein a part or all of the semiconductor elements configuring the semiconductor modules is a semiconductor having a band gap of 2.0 eV or higher.

11. The power converter according to claim 9,
wherein a part or all of the semiconductor elements configuring the semiconductor modules is made of one of silicon carbide, a gallium nitride material and diamond.

12. The power converter according to claim 1,
wherein the semiconductor modules electrically connected to a positive pole side of an input wiring and an output wiring is disposed on a first main surface of the cooler,
wherein a semiconductor modules electrically connected to a negative pole side of the input wiring and the output wiring is disposed on a second main surface of the cooler,
wherein the semiconductor modules disposed on the first main surface and the second main surface of the cooler are connected in series to form one power converter circuit,
wherein a positive pole side control board that controls the semiconductor modules at the positive pole side is mounted on the first main surface of the cooler,
wherein a negative pole side control board that controls the semiconductor modules at the negative pole side is mounted on the second main surface of the cooler,
wherein the respective control boards are electrically connected by the wirings that are disposed on the current detector or the terminal block, and electrically connect between the respective control boards, and
wherein the semiconductor modules are combined together to form one power conversion function.

13. The power converter according to claim 12,
wherein at least one of an array of a fixed structure of the semiconductor modules and the control boards arranged on both surfaces of the cooler, an array of an electric connection structure of the semiconductor modules and the control boards, and an array of an electric connection structure between the control boards and the current detector or the terminal block, are of the same shape on both surfaces of the cooler, and
wherein the semiconductor modules and the control boards rotate about an axis parallel to a surface where the input and output terminals of the semiconductor modules are arranged.

14. The power converter according to claim 12, further comprising:
driver circuits that drive the semiconductor modules, which are mounted at positions of the respective control boards disposed on the first main surface and the second main surface of the cooler, opposite to the semiconductor modules;
an output control circuit that is mounted at a position of one of the control boards opposite to the current detector or the terminal block, operates the semiconductor modules according to a calculation result using a current value detected by the current detector, and controls an output of the power converter; and
a power supply circuit for operating the control boards, which is mounted at a position of the other control board opposite to the current detector or the terminal block,
wherein the power supply circuit, and the driver circuits and the output control circuit are connected to each other for power supply by the wirings that are provided in the current detector or the terminal block, and electrically connect between the respective control boards, and
wherein the output control circuit and the driver circuits are connected to each other for signals.

15. The power converter according to claim 1,
wherein a first power conversion function is provided by the semiconductor module and the control board disposed on a first main surface of the cooler,
wherein a second power conversion function is provided by the semiconductor modules and the control board disposed on a second main surface of the cooler,
wherein the respective control boards configuring the first and second power conversion functions are electrically connected to each other by wirings that are provided in the current detector or the terminal block and electrically connect between the respective control boards to provide a function of changing respective operating states of the control board providing the first power conversion function and the control board providing the second power conversion function according to the operating states.

16. The power converter according to claim 1,
wherein the semiconductor module and the control board providing one power conversion function is dispersed on both surfaces of the cooler in the power converter having at least two power converters, wherein the respective dispersed circuits having the power conversion function are connected by the wirings that are provided in the current detector or the terminal block, and connect between the respective control boards, and wherein one power conversion function is realized by the semiconductor modules and the control board disposed on both surfaces of the cooler.

17. The power converter according to claim 15, wherein in any one of the semiconductor modules and the control board disposed on both surfaces of the cooler, the respective arrays of the fixed structure and the electric connection structure have the same shape on both surfaces of the cooler, and wherein the semiconductor modules and the control board rotate about an axis perpendicular to a surface on which the cooler faces the current detector or the terminal block.

18. The power converter according to claim 15, wherein the wirings that are provided in the current detector or the terminal block, and electrically connect between the respective control boards are arranged substantially in the center thereof, substantially on both ends thereof, or substantially in the center and on the both ends symmetrically with respect to a center of the current detector or the terminal block.

19. The power converter according to claim 1, further comprising: a smoothing capacitor unit for smoothing an input voltage of the semiconductor modules, wherein the cooler and the semiconductor modules are held between the smoothing capacitor unit and the current detector or the terminal block, and wherein the smoothing capacitor unit and the semiconductor modules are electrically connected directly to each other.

20. The power converter according to claim 19, wherein the smoothing capacitor unit includes capacitor elements, capacitor terminals that connect the capacitor elements and the semiconductor modules, and a capacitor case that protects connection portions of the capacitor elements and the capacitor terminals, and the capacitor elements, and has an insulation function, wherein the capacitor case has an opening in a surface facing a surface of the cooler which is not in contact with the semiconductor modules, wherein a height of the capacitor case is slightly larger than a distance between the highest surfaces of parts mounted on the two control boards disposed to face both surfaces of the cooler, and wherein a difference between the height and the distance ensures an insulation distance obtained by the power converter.

21. The power converter according to claim 19, wherein electrode surfaces that are joint surfaces of the capacitor elements and the capacitor terminals are arranged substantially in parallel to the surfaces of the cooler which come in contact with the semiconductor modules.

22. The power converter according to claim 1, wherein the cooler includes a semiconductor modules mounted plate on which the semiconductor modules are mounted and a cooling fin, wherein the cooling fin is held between the two semiconductor module mounted plates, and wherein the two semiconductor modules mounted plates and the cooling fin are joined together by soldering.

23. The power converter according to claim 19, wherein the terminals of the semiconductor modules and the capacitor terminals of the smoothing capacitor unit are fastened by a resin terminal block having a metal connection member, wherein the resin terminal block is fixed to the cooler through a high heat conducting member, and wherein the surface of the cooler which is not in contact with the semiconductor modules extends toward the smoothing capacitor unit side, and a part of the capacitor unit and the cooler contact each other directly or through the high heat conducting member.

24. The power converter according to claim 1, wherein the smoothing capacitor unit includes capacitor elements, capacitor terminals that connect the capacitor elements and the semiconductor modules, and a capacitor case that protects connection portions of the capacitor elements and the capacitor terminals, and the capacitor elements, and has an insulation function, wherein the smoothing capacitor unit is disposed at a position opposite to the control boards, wherein an occupied floor area of a capacitor element container in which the capacitor elements are disposed within the smoothing capacitor unit is a projected area of the control boards or lower, wherein the capacitor terminals are disposed substantially in parallel to a surface of the cooler on which the semiconductor modules are not mounted outside the capacitor case, and wherein in a portion where the capacitor terminals are disposed substantially in parallel to at least a surface of the cooler on which the semiconductor modules are not mounted, a positive pole and a negative pole are disposed close to each other through an insulating material.

25. The power converter according to claim 24, wherein the electrode surfaces for joining the capacitor elements and the capacitor terminals are disposed substantially in parallel to the surfaces of the cooler, which come in contact with the semiconductor modules.

26. The power converter according to claim 24, wherein the cooler includes two semiconductor modules mounted plates and the cooling fin, wherein the cooling fin is held between the semiconductor modules mounted plates, and wherein the two semiconductor modules mounted plates and the cooling fin are jointed together by soldering.

27. The power converter according to claim 24, wherein a power assembly is disposed on each surface of the smoothing capacitor unit, and wherein the capacitor case of the smoothing capacitor unit has the opening in a surface not opposite to the control boards.

* * * * *